United States Patent [19]
Oda

[11] Patent Number: 6,060,784
[45] Date of Patent: *May 9, 2000

[54] INTERCONNECTION LAYER STRUCTURE IN A SEMICONDUCTOR INTEGRATED CIRCUIT DEVICE HAVING MACRO CELL REGIONS

[75] Inventor: Noriaki Oda, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/768,577

[22] Filed: Dec. 18, 1996

[30] Foreign Application Priority Data

Dec. 18, 1995 [JP] Japan .................................... 7-329304

[51] Int. Cl.[7] .............................. H01L 23/48; H01L 29/12
[52] U.S. Cl. ........................ 257/758; 257/751; 257/763; 257/764; 257/765; 257/915
[58] Field of Search .................................... 257/758, 915, 257/751, 763, 764, 765

[56] References Cited

U.S. PATENT DOCUMENTS

| | | | |
|---|---|---|---|
| 5,471,093 | 11/1995 | Cheung | 257/758 |
| 5,500,558 | 3/1996 | Hayashide | 257/758 |
| 5,753,975 | 5/1998 | Matsuno | 257/751 |
| 5,760,429 | 6/1998 | Yano et al. | 257/211 |

FOREIGN PATENT DOCUMENTS

| | | |
|---|---|---|
| 1-138732 | 5/1989 | Japan . |
| 2-67730 | 3/1990 | Japan . |
| 2-296329 | 12/1990 | Japan . |
| 7-106324 | 4/1995 | Japan . |

*Primary Examiner*—Teresa M. Arroyo
*Attorney, Agent, or Firm*—Young & Thompson

[57] ABSTRACT

An interconnection layer extends across at least a macro cell region and at least a circuit region other than the macro cell region, the macro cell region and the circuit region being monolithically integrated into a semiconductor device, wherein the interconnection layer in the macro cell region is thinner than the interconnection layer in the circuit region.

9 Claims, 7 Drawing Sheets

Input　　　　　　　　　　　　　　　　Output

INTERCONNECTION LAYER STRUCTURE IN A SEMICONDUCTOR INTEGRATED CIRCUIT DEVICE HAVING MACRO CELL REGIONS

BACKGROUND OF THE INVENTION

The present invention relates to a semiconductor device, and more particularly to an improved interconnection layer structure in a semiconductor integrated circuit device having macro cell regions and a method of forming the same.

FIG. 1 is a fragmentary cross sectional elevation view illustrative of the conventional semiconductor device having a macro cell region a circuit region wherein interconnection layers having a uniform thickness and extend across the macro cell region and the circuit region.

A macro cell and a peripheral circuit region are monolithically integrated on a semiconductor substrate 1. A field oxide film 2 is selectively formed on a surface of the semiconductor substrate 1 at the boundary between the macro cell region and the peripheral circuit region. Both in the macro cell region and the peripheral circuit region, a plurality of field effect transistors are formed on the surface of the semiconductor substrate 1. Gate oxide films 3 having a thickness of 65 angstroms are formed on the surface of the semiconductor substrate 1. Gate electrodes 4 are formed on the gate oxide films 3. The gate electrodes 4 comprise polysilicon films having a thickness of 1500 angstroms. Side wall oxide films 5 are provided at opposite sides of each of the gate electrodes 4 to form lightly doped drain structures.

A first inter-layer insulator 6 is entirely formed over the semiconductor substrate 1 so that the first inter-layer insulator 6 covers the gate electrodes 4 of the field effect transistors. The first inter-layer insulator 6 is made of silicon oxide and boron-phosphate silicate glass. Contact holes 7 are selectively formed in the first inter-layer insulator 6. The contact holes 7 are filled with a refractory metal, for example, tungsten 8a. The first inter-layer insulator 6 has a top surface planerized across the macro cell region and the peripheral circuit region. First interconnection layers 9a and 9b are selectively formed which extend across the macro cell region and the peripheral circuit region. The first interconnection layers 9a are located in the macro cell region and the first interconnection layers 9b are located in the peripheral circuit region.

The first interconnection layers 9a and 9b have a uniform thickness and comprises laminations of a titanium layer 18a having a thickness of 300 angstroms, a titanium nitride layer 19a having a thickness of 1000 angstroms, an aluminum layer 20a having a thickness of 3000 angstroms, a titanium nitride layer 19b having a thickness of 500 angstroms, an aluminum layer 20b having a thickness of 3000 angstroms, and a titanium nitride layer 19c having a thickness of 500 angstroms.

The first interconnection layers 9a and 9b are connected via the contact holes 7 filled with the tungsten 8a to the field effect transistors. The first interconnection layers 9a located in the macro cell region has the same width as the first interconnection layers 9b located in the peripheral circuit region, for example, the width of the interconnection layers 9a and 9b is 0.3 micrometers. Over the macro cell region and the peripheral circuit region, the first interconnection layers 9a and 9b are arranged in parallel to each other at a constant pitch of 0.4 micrometers in consideration of facilitated circuit layout design. As a design modification, it is however possible to arrange the first interconnection layers 9a and 9b at various pitches or different pitches across the macro cell region and the peripheral circuit region.

A second inter-layer insulator 10 is entirely provided over the first inter-layer insulator 6 so that the second inter-layer insulator 10 covers the first interconnection layers 9a and 9b. The second inter-layer insulator 10 is made of silicon oxide and deposited by a plasma chemical vapor deposition method. The second inter-layer insulator 10 has a top surface planerized across the macro cell region and the peripheral circuit region. Via holes 11 are selectively formed in the second inter-layer insulator 10. A barrier metal layer 12 is formed on the bottom and side wall of each of the via holes 11 as well as selectively formed over the top surface of the second inter-layer insulator 10. The barrier metal layer 12 comprises laminations of a titanium nitride film having a thickness of 1000 angstroms and a titanium film having a thickness of 300 angstroms. Each of the via holes 11 coated by the barrier metal layer 12 is filled with a tungsten 8b. Second interconnection layers 13a and 13b are provided on the second inter-layer insulator 10. The second interconnection layers 13a are located in the macro cell region, whilst the second interconnection layers 13b are located in the peripheral circuit region.

The second interconnection layers 13a and 13b have a uniform thickness and comprises laminations of a titanium layer 18a having a thickness of 300 angstroms, a titanium nitride layer 19a having a thickness of 1000 angstroms, an aluminum layer 20a having a thickness of 3000 angstroms, a titanium nitride layer 19b having a thickness of 500 angstroms, an aluminum layer 20b having a thickness of 3000 angstroms, and a titanium nitride layer 19c having a thickness of 500 angstroms.

The thickness of the second interconnection layers 13a located in the macro cell region is the same as the thickness of the second interconnection layers 13b located in the peripheral circuit region. A cover layer 14 is further provided which covers the second interconnection layers 13a and 13b. The cover layer 14 is made of silicon oxide nitride, SiON.

Figure 1:
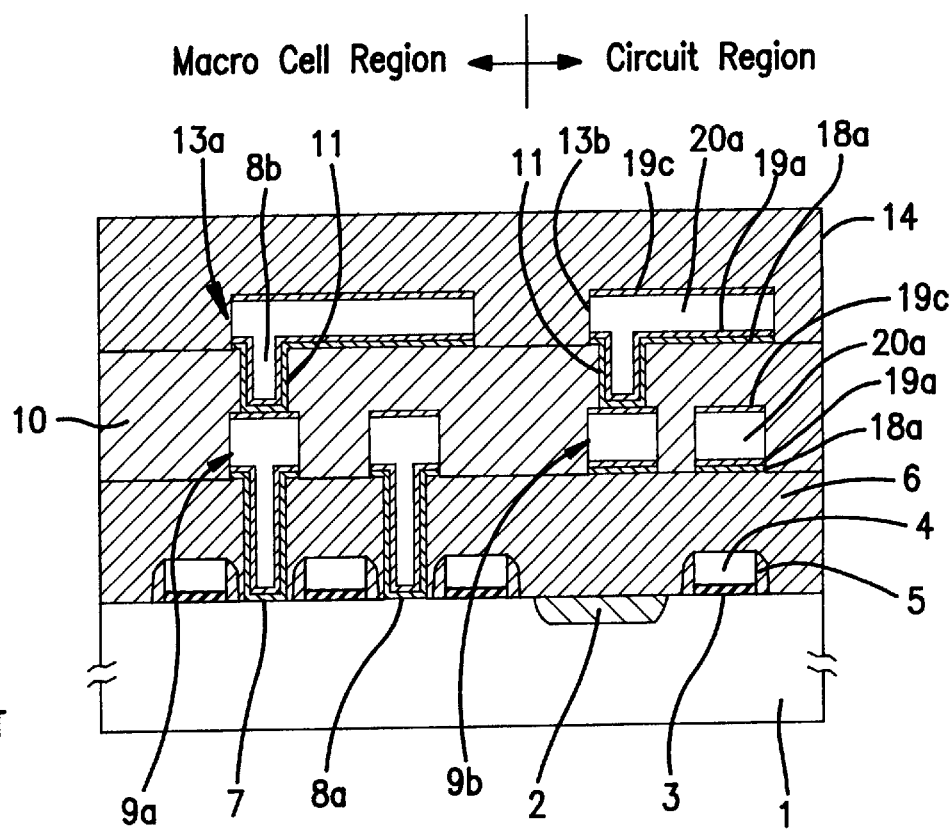

The above conventional semiconductor device has the following disadvantages. In the conventional semiconductor device, the interconnection layer has a uniform thickness across the macro cell region and the peripheral. Normally, the lengths of the interconnection layers in the macro cell region are shorter on the average than the lengths of the interconnection layers in the peripheral circuit region. Since the averaged lengths of the interconnection layers in the macro cell region are relatively short, no serious problem with increase in the resistance of the interconnections is raised in the macro cell region even though the thicknesses of the interconnection layers are reduced. However, a reduction in the thickness of the interconnection layers increases resistance of the interconnections in the peripheral circuit region, causing a delay of the signal transmission on the interconnections in the peripheral circuit region. On the other hand, if a sufficient thickness is kept for the interconnection layers, then the interconnection capacitance increases between adjacent two interconnections, resulting in a time-delay of signal transmission on the interconnections in the macro cell region.

SUMMARY OF THE INVENTION

Accordingly, it is an object of the present invention to provide an interconnection layer extending across at least a macro cell region and at least a circuit region other than the macro cell region free from the above problem described above.

It is a further object of the present invention to provide an interconnection layer extending across at least a macro cell region and at least a circuit region other than the macro cell region, which is suitable for scaling down of the macro cell.

It is a furthermore object of the present invention to provide an interconnection layer extending across at least a macro cell region and at least a circuit region other than the macro cell region, which is free from any problem with increase in an interconnection capacitance between adjacent two interconnections in the macro cell suitable for scaling down of the macro cell.

It is a furthermore object of the present invention to provide an interconnection layer extending across at least a macro cell region and at least a circuit region other than the macro cell region, which is free from any problem with a time-delay in signal transmissions on the interconnections in the macro cell region.

The first present invention provides an interconnection layer extending across at least a macro cell region and at least a circuit region other than the macro cell region. The macro cell region and the circuit region are monolithically integrated into a semiconductor device. It is important for the present invention that the interconnection layer in the macro cell region is thinner than the interconnection layer in the circuit region.

It is a still further object of the present invention to provide a multi-level interconnection structure extending across at least a macro cell region and at least a circuit region other than the macro cell region free from the above problem described above.

It is yet a further object of the present invention to provide a multi-level interconnection structure extending across at least a macro cell region Land at least a circuit region other than the macro cell region, which is suitable for scaling down of the macro cell.

It is still more an object of the present invention to provide a multi-level interconnection structure extending across at least a macro cell region and at least a circuit region other than the macro cell region, which is free from any problem with increase in an interconnection capacitance between adjacent two interconnections in the macro cell suitable for scaling down of the macro cell.

It is moreover an object of the present invention to provide a multi-level interconnection structure extending across at least a macro cell region and at least a circuit region other than the macro cell region, which is free from any problem with a time-delay in signal transmissions on the interconnections in the macro cell region.

The third present invention provides a multi-level interconnection structure comprising the following elements. A first interconnection layer extends across at least a macro cell region and at least a circuit region other than the macro cell region. The macro cell region and the circuit region are monolithically integrated into a semiconductor device. An inter-layer insulator extends over the first interconnection layer and extends across the macro cell region and the circuit region, the inter-layer insulator having a first via hole in the macro cell region and a second via hole in the circuit region, and a second interconnection layer extending over the inter-layer insulator and extending across the macro cell region and the circuit region. The second interconnection layer is electrically connected through the first and second via holes to the first interconnection layer. It is important for the present invention that the first interconnection layer in the function cell region is thinner than the first interconnection layer in the circuit region and also that the inter-layer insulator has a uniform top surface level over the macro cell region and the circuit region.

It is another object of the present invention to provide a semiconductor device comprising a semiconductor substrate, at least a macro cell region and a circuit region, both of which are monolithically integrated on the semiconductor substrate, and at least an interconnection layer extending across the macro cell region and the circuit region, which is free from the above problem described above.

It is still another object of the present invention to provide a semiconductor device comprising a semiconductor substrate, at least a macro cell region and a circuit region, both of which are monolithically integrated on the semiconductor substrate, and at least an interconnection layer extending across the macro cell region and the circuit region, which is suitable for scaling down of the macro cell.

It is yet another object of the present invention to provide a semiconductor device comprising a semiconductor substrate, at least a macro cell region and a circuit region, both of which are monolithically integrated on the semiconductor substrate, and at least an interconnection layer extending across the macro cell region and the circuit region, which is free from any problem with increase in an interconnection capacitance between adjacent two interconnections in the macro cell suitable for scaling down of the macro cell.

It is still another object of the present invention to provide a semiconductor device comprising a semiconductor substrate, at least a macro cell region and a circuit region, both of which are monolithically integrated on the semiconductor substrate, and at least an interconnection layer extending across the macro cell region and the circuit region, which is free from any problem with a time-delay in signal transmissions on the interconnections in the macro cell region.

The above and other objects, features and advantages of the present invention will be apparent from the following descriptions.

BRIEF DESCRIPTIONS OF THE DRAWINGS

Preferred embodiments of the present invention will be described with reference to the accompanying drawings.

FIG. 1 is a fragmentary cross sectional elevation view illustrative of the conventional semiconductor device having a macro cell region and a circuit region wherein interconnection layers extend across the macro cell region and the circuit region.

Figure 2A:
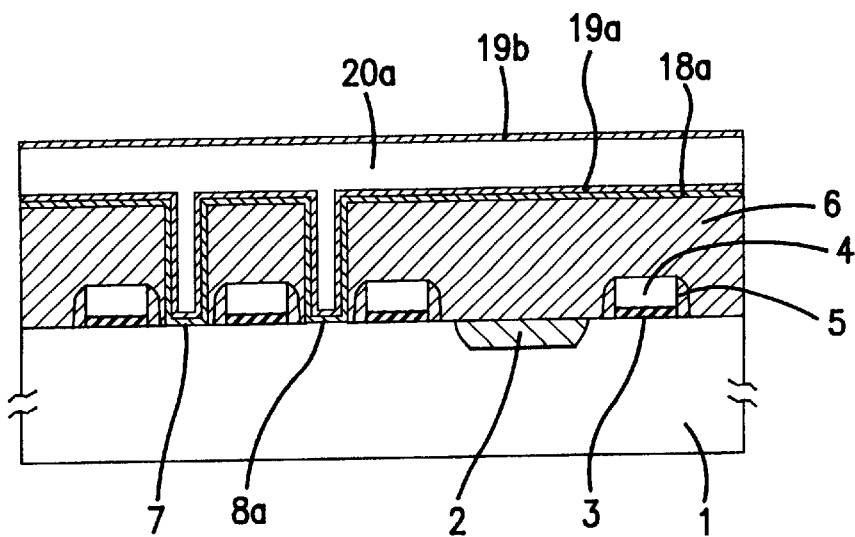
FIGS. 2A and 2B are fragmentary cross sectional elevation views illustrative of sequential processes involved in a method of forming the conventional semiconductor device of FIG. 1.
Figure 2B:
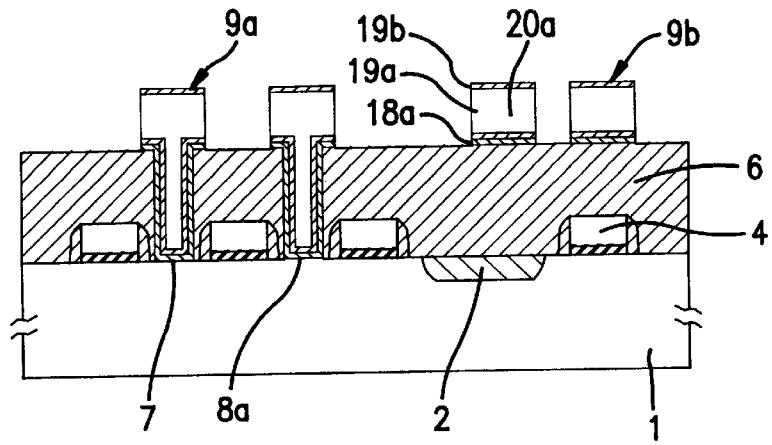

FIGS. 2A and 2B are fragmentary cross sectional elevation views illustrative of sequential processes involved in a method of forming the conventional semiconductor device of FIG. 1.

Figure 3:
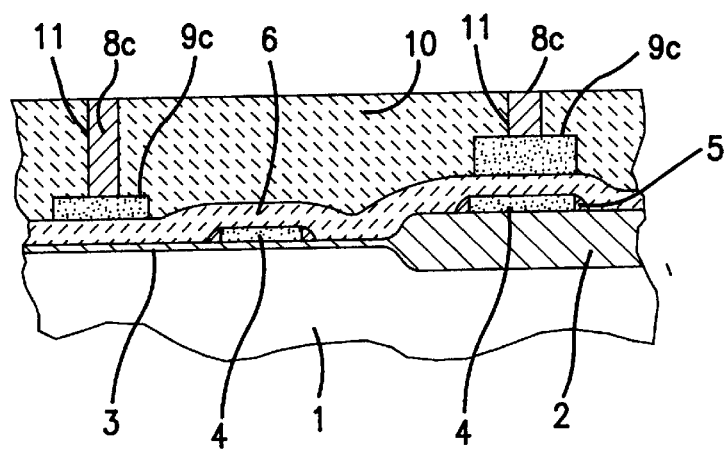
FIG. 3 is a fragmentary cross sectional elevation view illustrative of the other conventional semiconductor device having a macro cell region and a circuit region wherein interconnection layers having a uniform thickness extend across the macro cell region and the circuit region.

FIG. 3 is a fragmentary cross sectional elevation view illustrative of the other conventional semiconductor device having a macro cell region and a circuit region wherein interconnection layers extend across the macro cell region and the circuit region.

Figure 4:
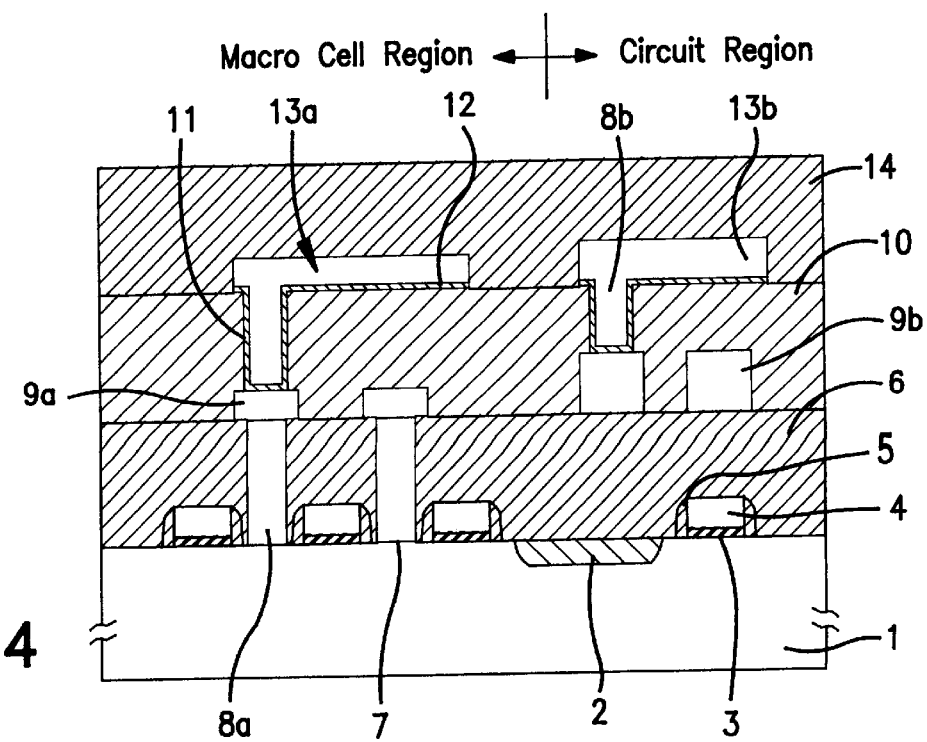

FIG. 4 is a fragmentary cross sectional elevation view illustrative of a novel semiconductor device having a macro cell region and a circuit region wherein improved interconnection layers extend across the macro cell region and the circuit region in a first embodiment according to the present invention.

Figure 5:
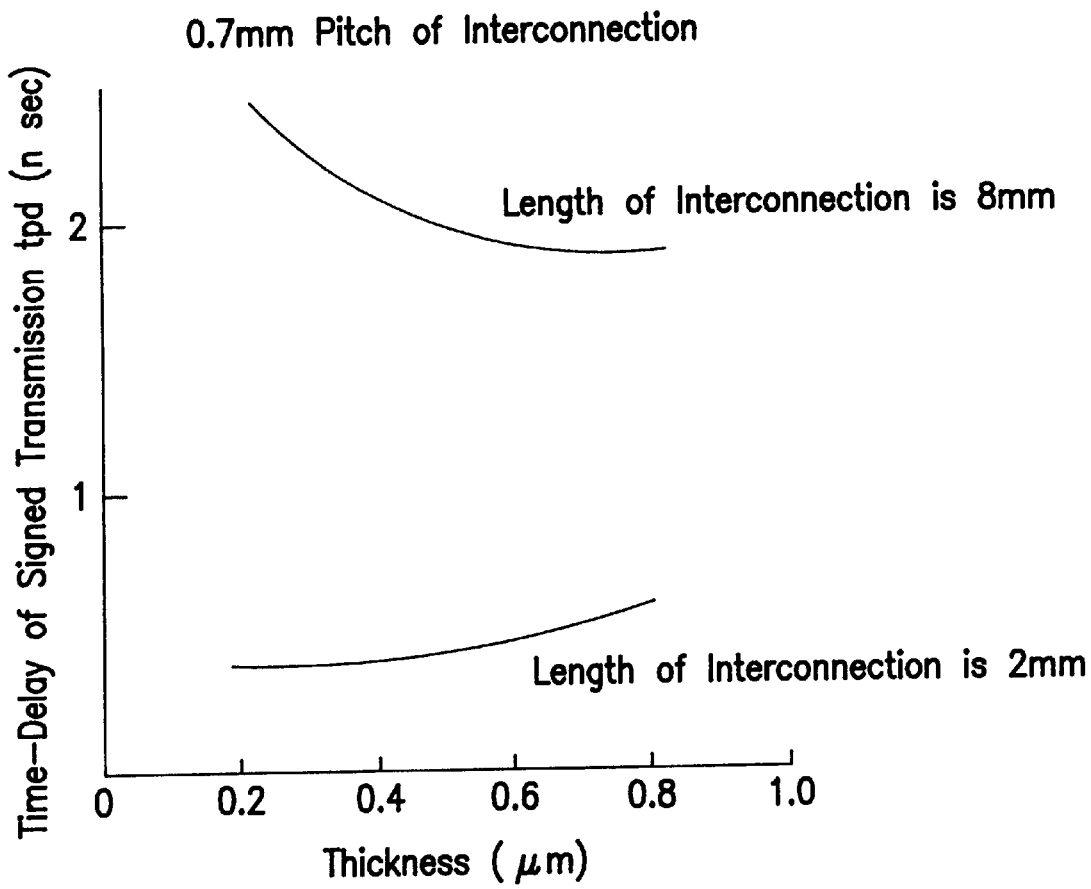

FIG. 5 is a diagram illustrative of variations in time-delay of signal transmission on interconnection layers of 8 mm and 2 mm lengths over thickness of the interconnection layers, wherein the pitch between adjacent two interconnections is set at 0.7 micrometers.

Figure 6:
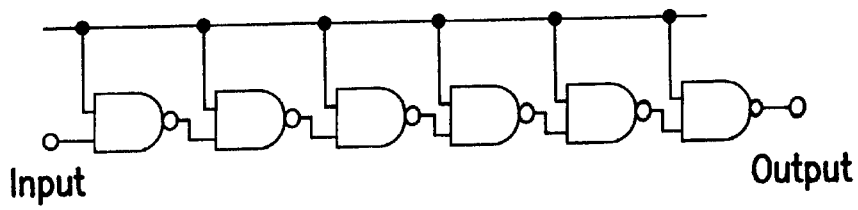

FIG. 6 is a circuit diagram illustrative of a logic circuit used for measuring the variations in time-delay of signal transmission on interconnection layers.

Figure 7:
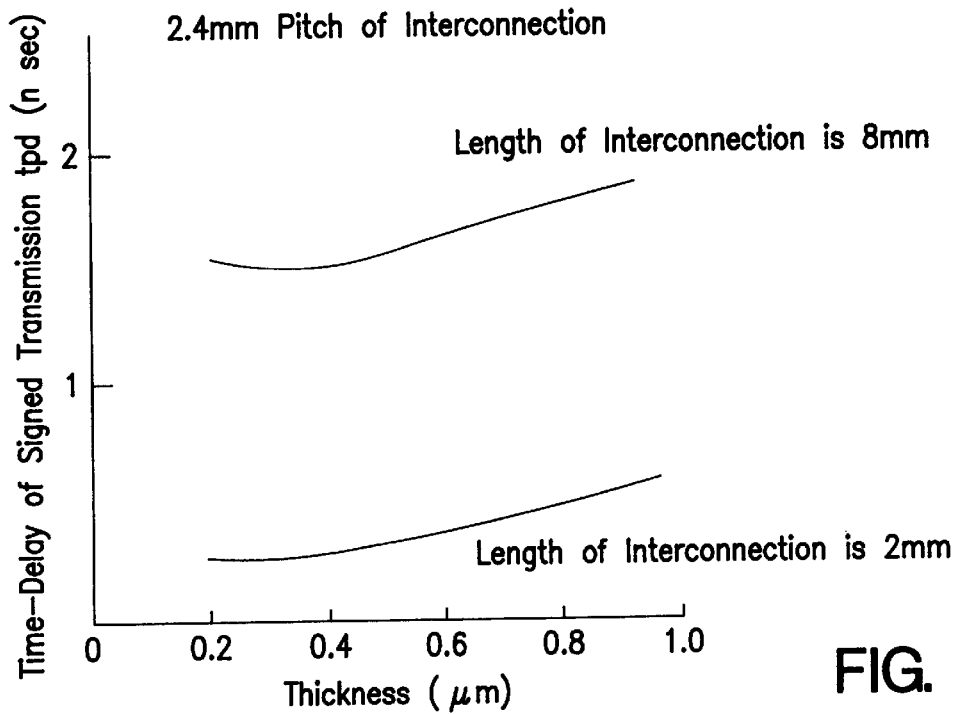

FIG. 7 is a diagram illustrative of variations in time-delay of signal transmission on interconnection layers of 8 mm and 2 mm lengths over thickness of the interconnection layers, wherein the pitch between adjacent two interconnections is set at 2.4 micrometers.

Figure 8A:
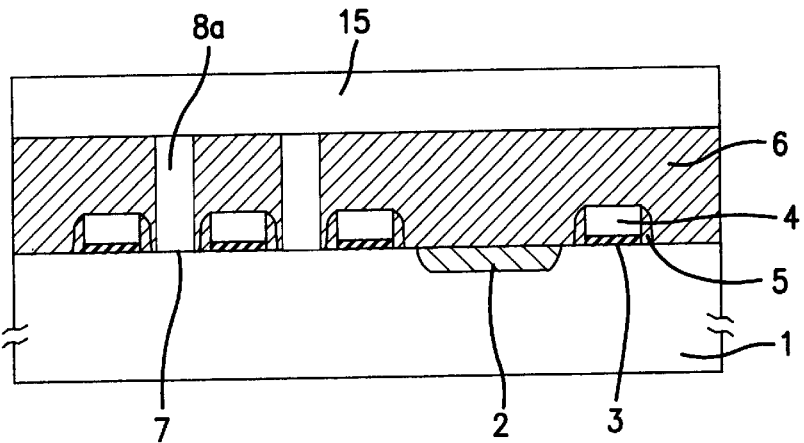
Figure 8B:
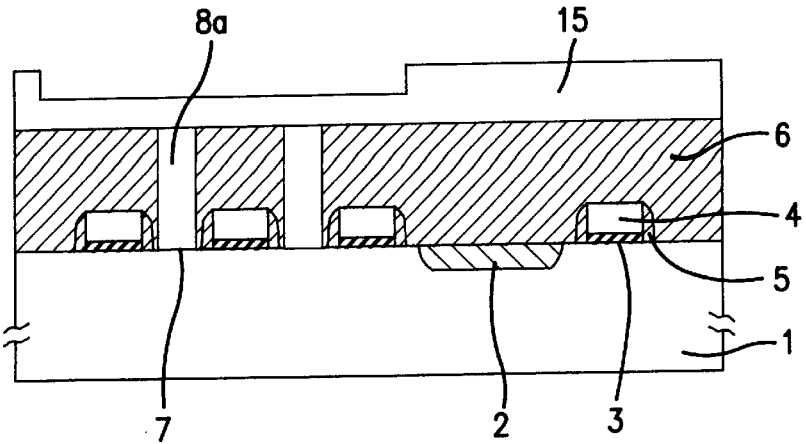
Figure 8C:
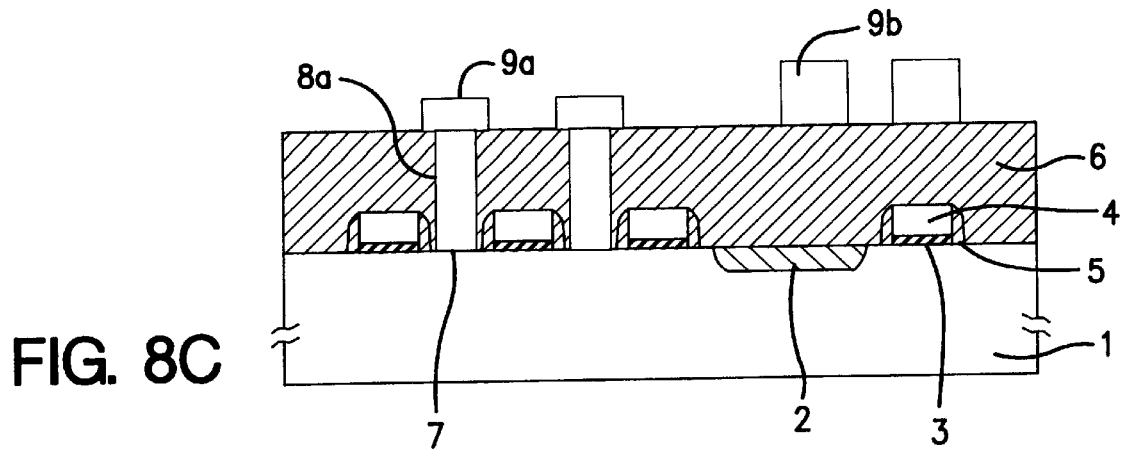

FIGS. 8A and 8C are fragmentary cross sectional elevation views illustrative of sequential processes involved in an improved method of forming a novel semiconductor device of FIG. 4.

Figure 9:
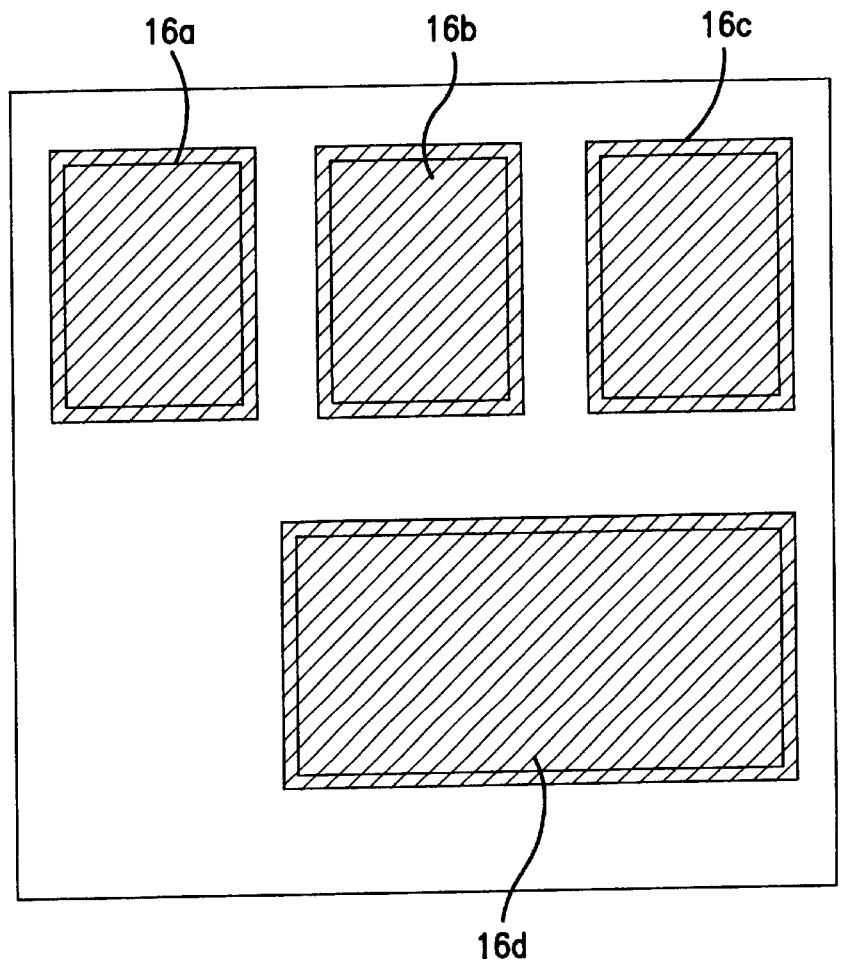

FIG. 9 is a plane view illustrative of a layout of a mask used in a process involved in an improved method of forming a novel semiconductor device of FIG. 4.

Figure 10:
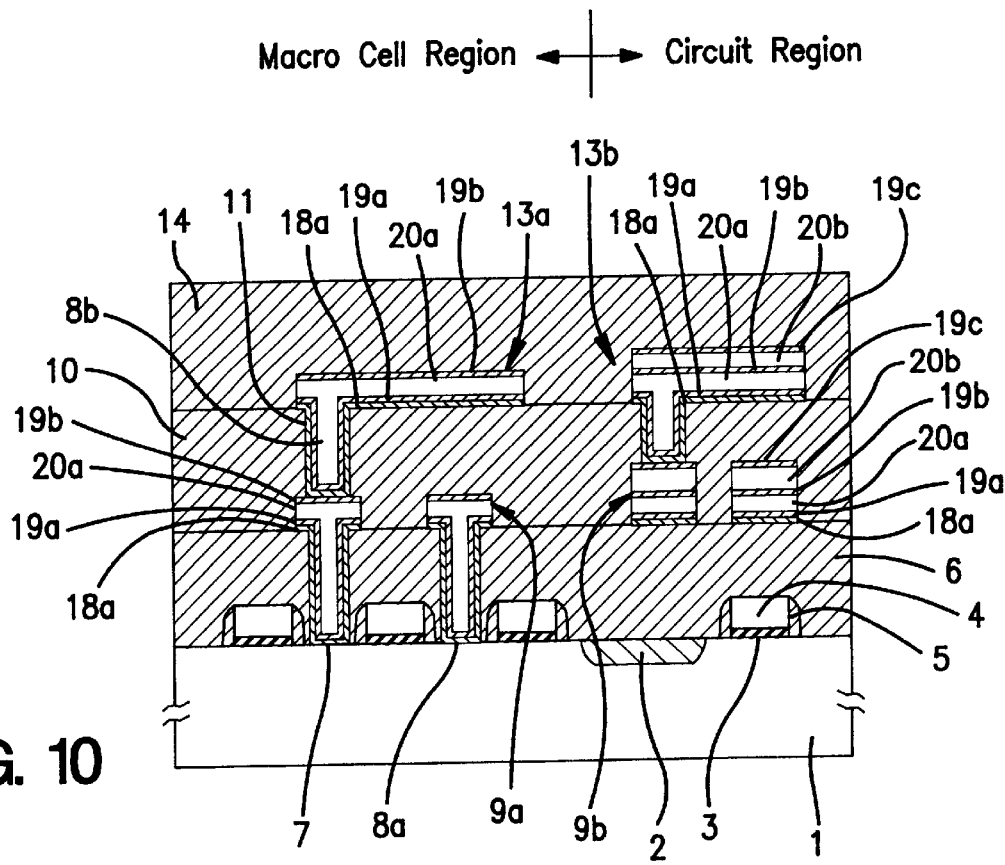

FIG. 10 is a fragmentary cross sectional elevation view illustrative of a novel semiconductor device having a macro cell region and a circuit region wherein improved interconnection layers extend across the macro cell region and the circuit region in a second embodiment according to the present invention.

Figure 11:
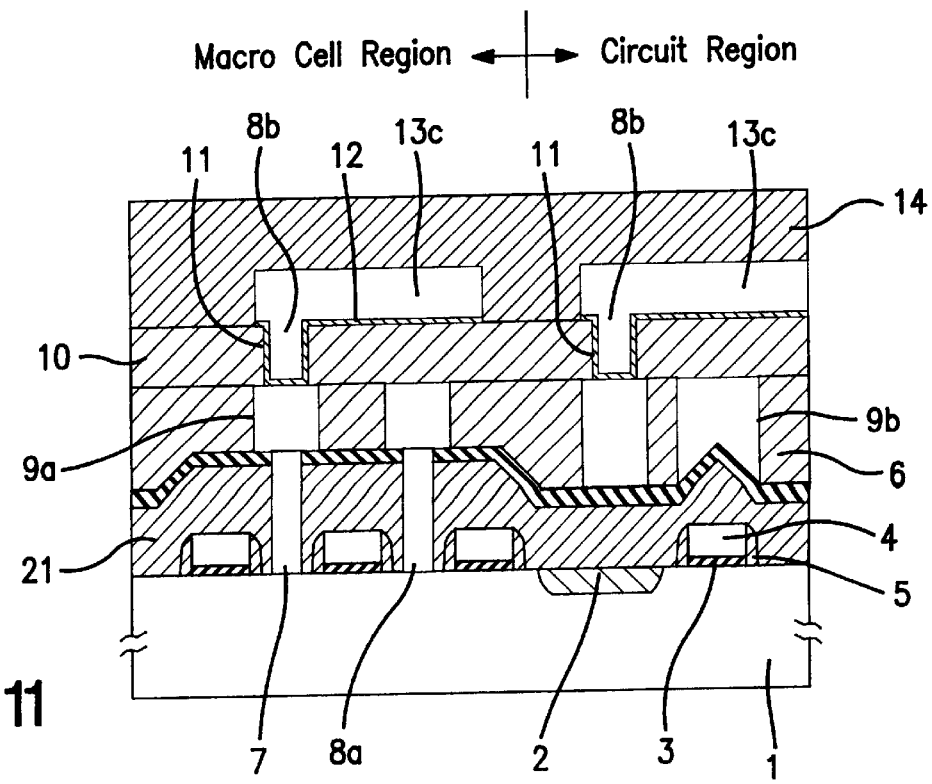

FIG. 11 is a fragmentary cross sectional elevation view illustrative of a novel semiconductor device having a macro cell region and a circuit region wherein improved interconnection layers extend across the macro cell region and the circuit region in a third embodiment according to the present invention.

Figure 12A:
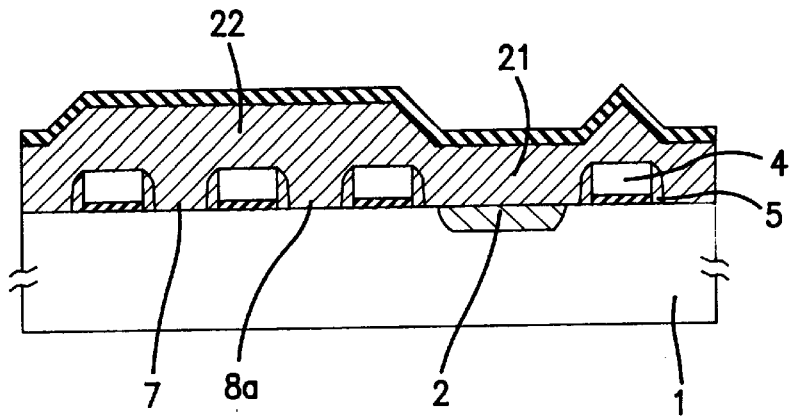
Figure 12B:
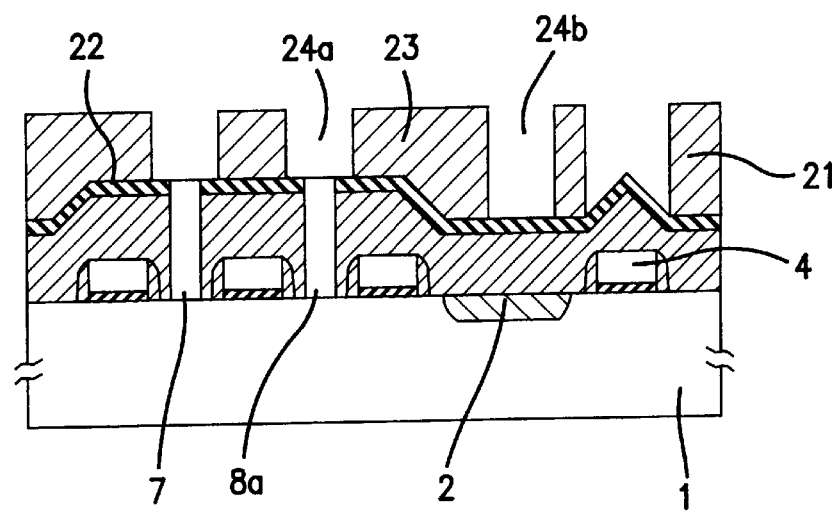
Figure 12C:
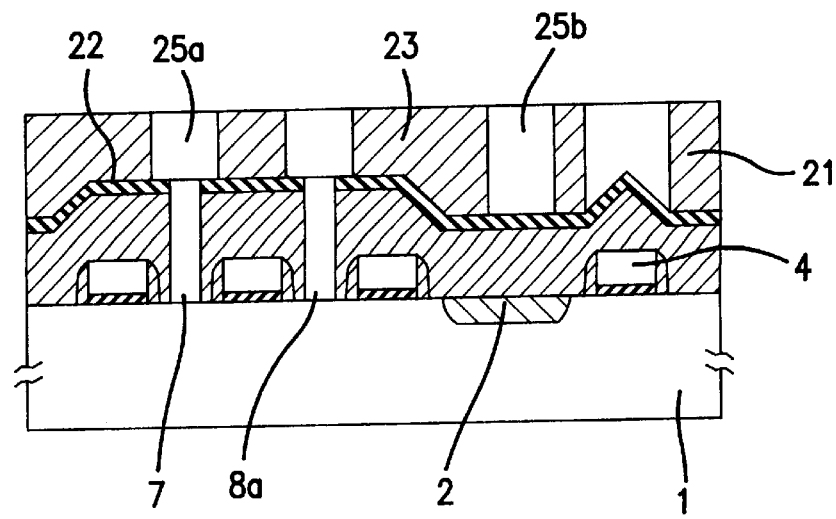

FIGS. 12A and 12C are fragmentary cross sectional elevation views illustrative of sequential processes involved in an improved method of forming a novel semiconductor device of FIG. 11.

DISCLOSURE OF THE INVENTION

The first embodiment of the present invention provides an interconnection layer extending across at least a macro cell region and at least a circuit region other than the macro cell region. The macro cell region and the circuit region are monolithically integrated into a semiconductor device. It is important for the present invention that the interconnection layer in the macro cell region is thinner than the interconnection layer in the circuit region.

The lengths of the interconnection layers in the micro cell region are shorter on the average than lengths of the interconnection layers in the peripheral circuit region. Since the average length of the interconnection layers in the micro cell region is relatively short, there is no problem with increased resistance of the interconnections is in the macro cell region even though the thicknesses of the interconnection layers are reduced. In the macro cell region, the interconnections need to be arranged as close as possible for scaling down the macro cell, for which reason the increase in the interconnection capacitance between the adjacent two interconnections and a time delay of signal transmission on the interconnections would be more important and serious issues for the macro cell. In accordance with the present invention, the thickness of the interconnection in the macro cell region is substantially reduced so as to reduce the interconnection capacitance between the adjacent two interconnections and suppress the time-delay of signal transmissions on the interconnections in the macro cell region.

On the other hand, in the circuit region, the average length of the interconnections is relatively long, for which reason as increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the macro cell region in order to reduce the resistance of the interconnection layers in the circuit region. It is preferable that the interconnection layer in the macro cell region has a first thickness and the interconnection layer in the circuit region has a second thickness which is larger than the first thickness.

It is preferable that the interconnection layer in the macro cell region has a first thickness and the interconnection layer in the circuit region has a second thickness which is larger than the first thickness.

It is further preferable that the first thickness is approximately equal to a half of the second thickness.

It is also preferable that the macro cell region includes at least a field effect transistor with a gate electrode film, and the interconnection layer in the macro cell region has a first thickness and the interconnection layer in the circuit region has a second thickness which is equal to the sum of the first thickness and a thickness of the gate electrode film.

It is also preferable that the interconnection layer has a uniform top surface level across the macro cell region and the circuit region.

It is also preferable that the interconnection layer has a uniform bottom surface level across the macro cell region and the circuit region.

It is also preferable that the interconnection layer comprises a single layer which is mainly made of aluminum.

It is also preferable that the interconnection layer comprises a titanium layer extending across the macro cell region and the circuit region, a first titanium nitride layer being laminated on the titanium layer and extending across the macro cell region and the circuit region, a first aluminum layer being laminated on the first titanium nitride layer and extending across the macro cell region and the circuit region, a second titanium nitride layer being laminated on the first aluminum layer and extending across the macro cell region and the circuit region, a second aluminum layer being laminated on the second titanium nitride layer and extending across the circuit region, and a third titanium nitride layer being laminated on the second aluminum layer and extending across the circuit region.

The second embodiment of the present invention provides an interconnection layer extending across at least a function cell region and at least a circuit region other than the function cell region. The function cell region and the circuit region are monolithically integrated into a semiconductor device. It is important for the present invention that the interconnection layer in the function cell region is thinner on the average than the interconnection layer in the circuit region.

The lengths of the interconnection layers in the function cell region are shorter on average than the lengths of the interconnection layers in the peripheral circuit region. Since the average length of the interconnection layer in the function cell region is relatively short, there is no problem with an increase in the resistance of the interconnections in the function cell region even the thicknesses of the interconnection layers are reduced. In the function cell region, the interconnections need to be arranged as close as possible for scaling down the function cell, for which reason the increase in the interconnection capacitance between the adjacent two interconnections and a time delay of signal transmission on the interconnections would be more important for the function cell. In accordance with the present invention, the thickness of the interconnection in the function cell region is substantially reduced so as to reduce the interconnection capacitance between the adjacent two interconnections and suppress the time-delay of signal transmissions on the interconnections in the function cell region.

On the other hand, in the circuit region, the average length of the interconnections is relatively long, for which reason an increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the function cell region in order to reduce the resistance of the interconnection layers in the circuit region. It is preferable that the interconnection layer in the function cell region has a first thickness and the interconnection layer in the circuit region has a second thickness which is larger than the first thickness.

It is preferable that the interconnection layer in the function cell region has a first thickness and the interconnection layer in the circuit region has a second thickness which is larger than the first thickness.

It is further preferable that the first thickness is approximately equal to a half of the second thickness.

It is also preferable that the function cell region includes at least a field effect transistor with a gate electrode film, and the interconnection layer in the function cell region has a first thickness and the interconnection layer in the circuit region has a second thickness which is equal to the sum of the first thickness and a thickness of the gate electrode film.

It is also preferable that the interconnection layer has a uniform top surface level across the function cell region and the circuit region.

It is also preferable that the interconnection layer has a uniform bottom surface level across the function cell region and the circuit region.

It is also preferable that the interconnection layer comprises a single layer which is mainly made of aluminum.

It is also preferable that the interconnection layer comprises a titanium layer extending across the function cell region and the circuit region, a first titanium nitride layer being laminated on the titanium layer extending across the function cell region and the circuit region, a first aluminum layer being laminated on the first titanium nitride layer and extending across the function cell region and the circuit region, a second titanium nitride layer being laminated on the first aluminum layer and extending across the function cell region and the circuit region, a second aluminum layer being laminated on the second titanium nitride layer and extending across the circuit region, and a third titanium nitride layer being laminated on the second aluminum layer extending across the circuit region.

The third embodiment of the present invention provides a multi-level interconnection structure comprising the following elements. A first interconnection layer extends across at least a macro cell region and at least a circuit region other than the macro cell region. The macro cell region and the circuit region are monolithically integrated into a semiconductor device. An inter-layer insulator extends over the first interconnection layer and extends across the macro cell region and the circuit region, the inter-layer insulator having a first via hole in the macro cell region and a second via hole in the circuit region, and a second interconnection layer extending over the inter-layer insulator and extending across the macro cell region and the circuit region. The second interconnection layer is electrically connected through the first and second via holes to the first interconnection layer. It is important for the present invention that the first interconnection layer in the function cell region is thinner than the first interconnection layer in the circuit region and also that the inter-layer insulator has a uniform top surface level over the macro cell region and the circuit region.

The lengths of the interconnection layers in the micro cell region are shorter on the average than the lengths of the interconnection layers in the peripheral circuit region. Since the average length of the interconnection layers in the micro cell region is relatively short, there is no problem with an increase in the resistance of the interconnections in the macro cell region even though the thicknesses of the interconnection layers are reduced. In the macro cell region, the interconnections need to be arranged as close as possible for scaling down the macro cell, for which reason the increase in the interconnection capacitance between the adjacent two interconnections and a time delay of signal transmission on the interconnections would be more important for the macro cell. In accordance with the present invention, the thickness of the interconnection in the macro cell region is substantially reduced so as to reduce the interconnection capacitance between the adjacent two interconnections and suppress the time-delay of signal transmission on the interconnections in the macro cell region.

On the other hand, in the circuit region, the average length of the interconnections is relatively long, for which reason an increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the macro cell region in order to reduce the resistance of the interconnection layers in the circuit region. It is preferable that the interconnection layer in the macro cell region has a first thickness and the interconnection layer in the circuit region has a second thickness which is larger than the first thickness.

It is preferable that the first interconnection layer in the macro cell region has a first thickness and the first interconnection layer in the circuit region has a second thickness which is approximately equal to two times the first thickness.

It is also preferable that the macro cell region includes at least a field effect transistor with a gate electrode film, and the first interconnection layer in the macro cell region has a first thickness and the first interconnection layer in the circuit region has a second thickness which is equal to the sum of the first thickness and a thickness of the gate electrode film.

It is also preferable that the first interconnection layer has a uniform top surface level across the macro cell region and the circuit region.

It is also preferable that the first interconnection layer has a uniform bottom surface level across the macro cell region and the circuit region.

It is also preferable that the second interconnection layer in the function cell region is thinner than the second interconnection layer in the circuit region.

It is also preferable that the second interconnection layer has a uniform thickness across the function cell region and the circuit region.

It is also preferable that the inter-layer insulator in the macro cell region is thicker than the inter-layer insulator in the circuit region and the first via hole in the macro cell region has a larger depth than the second via hole in the circuit region.

It is also preferable that each of the first and second interconnection layers comprises a single layer which is mainly made of aluminum.

It is also preferable that each of the first and second interconnection layers comprises a titanium layer extending across the macro cell region and the circuit region, a first titanium nitride layer laminated on the titanium layer and extending across the macro cell region and the circuit region, a first aluminum layer being laminated on the first titanium nitride layer and extending across the macro cell region and the circuit region, a second titanium nitride layer being laminated on the first aluminum layer and extending across the macro cell region and the circuit region, a second aluminum layer being laminated on the second titanium nitride layer and extending across the circuit region and a third titanium nitride layer being laminated on the second aluminum layer and extending across the circuit region.

The fourth embodiment of the present invention provides a multi-level interconnection structure comprising the following elements. A first interconnection layer extends across at least a macro cell region and at least a circuit region other than the macro cell region. The macro cell region and the circuit region are monolithically integrated into a semiconductor device. An inter-layer insulator extends over the first interconnection layer and extends across the macro cell region and the circuit region. A second interconnection layer extends over the inter-layer insulator and extends across the macro cell region and the circuit region. It is important for the present invention that the first interconnection layer in the function cell region is thinner than the first interconnection layer in the circuit region, and that the first interconnection layer has a uniform top surface level across the macro cell region and the circuit region as well as the first interconnection layer in the macro cell region has a higher bottom level than the first interconnection layer in the circuit region. It is further important that the inter-layer insulator has flat top and bottom surfaces across the macro cell region and the circuit region.

The lengths of the interconnection layers in the micro cell region are shorter on the average than the lengths of the interconnection layers in the peripheral circuit region. Since the average length of the interconnection layers in the micro cell region is relatively short, there is no problem with an increase in the resistance of the interconnections is in the macro cell region even though the thicknesses of the interconnection layers are reduced. In the macro cell region, the interconnections need to be arranged as close as possible for scaling down the macro cell, for which reason the increase in the interconnection capacitance between the adjacent two interconnections and a time delay of signal transmission on the interconnections would be more important for the macro cell. In accordance with the present invention, the thickness of the interconnection in the macro cell region is substantially reduced so as to reduce the interconnection capacitance between the adjacent two interconnections and suppress the time-delay of signal transmissions on the interconnections in the macro cell region.

On the other hand, in the circuit region, the average length of the interconnections is relatively long, for which reason increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the macro cell region in order to reduce the resistance of the interconnection layers in the circuit region. It is preferable that the interconnection layer in the macro cell region has a first thickness and the interconnection layer in the circuit region has a second thickness which is larger than the first thickness.

It is preferable that the first interconnection layer in the macro cell region has a first thickness and the first interconnection layer in the circuit region has a second thickness which is approximately equal to two times of the first thickness.

It is also preferable that the macro cell region includes at least a field effect transistor with a gate electrode film, and the first interconnection layer in the macro cell region has a first thickness and the first interconnection layer in the circuit region has a second thickness which is equal to the sum of the first thickness and a thickness of the gate electrode film.

It is also preferable that the first interconnection layer has a uniform bottom surface level across the macro cell region and the circuit region.

It is also preferable that the second interconnection layer in the function cell region is thinner than the second interconnection layer in the circuit region.

It is also preferable that the second interconnection layer has a uniform thickness across the function cell region and the circuit region.

It is also preferable that the inter-layer insulator in the macro cell region is thicker than the inter-layer insulator in the circuit region and the first via bole in the macro cell region has a larger depth than the second via hole in the circuit region.

It is also preferable that each of the first and second interconnection layers comprises a single layer which is mainly made of aluminum.

It is also preferable that each of the first and second interconnection layers comprises a titanium layer extending across the macro cell region and the circuit region, a first titanium nitride layer laminated on the titanium layer and extending across the macro cell region and the circuit region, a first aluminum layer being laminated on the first titanium nitride layer and extending across the macro cell region and the circuit region, a second titanium nitride layer being laminated on the first aluminum layer and extending across the macro cell region and the circuit region, a second aluminum layer being laminated on the second titanium nitride layer and extending across the circuit region, and a third titanium nitride layer laminated on the second aluminum layer and extending across the circuit region.

The fifth embodiment of the present invention provides a semiconductor device comprising a semiconductor substrate, at least a macro cell region and a circuit region, both of which are monolithically integrated on the semiconductor substrate, and at least an interconnection layer extending across the macro cell region and the circuit region. It is important for the present invention that the interconnection layer in the macro cell region is thinner than the interconnection layer in the circuit region.

The lengths of the interconnection layers in the micro cell region are shorter on the average than the lengths of the interconnection layers in the peripheral circuit region. Since the average length of the interconnection layers in the micro cell region is relatively short, there is no problem with an increase in the resistance of the interconnections in the macro cell region even the thicknesses of the interconnection layers are reduced. In the macro cell region, the interconnections need to be arranged as close as possible for scaling down the macro cell, for which reason the increase in the interconnection capacitance between the adjacent two interconnections and a time delay of signal transmission on the interconnections would be more important for the macro cell. In accordance with the present invention, the thickness of the interconnection in the macro cell region is substantially reduced so as to reduce the interconnection capacitance between the adjacent two interconnections and suppress the time-delay of signal transmissions on the interconnections in the macro cell region.

On the other hand, in the circuit region, the average length of the interconnections is relatively long, for which reason an increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the macro cell region in order to reduce the resistance of the interconnection layers in the circuit region. It is preferable that the interconnection layer in the macro cell region has a first thickness and the interconnection layer in the circuit region has a second thickness which is larger than the first thickness.

It is also preferable that the first thickness is approximately equal to a half of the second thickness.

It is also preferable that the macro cell region includes at least a field effect transistor with a gate electrode film, and the interconnection layer in the macro cell region has a first thickness and the interconnection layer in the circuit region has a second thickness which is equal to the sum of the first thickness and a thickness of the gate electrode film.

It is also preferable that the interconnection layer has a uniform top surface level across the macro cell region and the circuit region.

It is also preferable that the interconnection layer has a uniform bottom surface level across the macro cell region and the circuit region.

It is also preferable that the interconnection layer comprises a single layer which is mainly made of aluminum.

It is also preferable that the interconnection layer comprises a titanium layer extending across the macro cell region and the circuit region, a first titanium nitride layer being laminated on the titanium layer and extending across the macro cell region and the circuit region, a first aluminum layer being laminated on the first titanium nitride layer and extending across the macro cell region and the circuit region, a second titanium nitride layer being laminated on the first aluminum layer and extending across the macro cell region and the circuit region, a second aluminum layer being laminated on the second titanium nitride layer and extending across the circuit region, a third titanium nitride layer being laminated on the second aluminum layer and extending across the circuit region.

The sixth embodiment of the present invention provides a semiconductor device comprising a semiconductor substrate, at least a function cell region and a circuit region, both of which are monolithically integrated on the semiconductor substrate, and at least an interconnection layer extending across the function cell region and the circuit region. It is important for the present invention that the interconnection layer in the function cell region is thinner on average than the interconnection layer in the circuit region.

The lengths of the interconnection layers in the function cell region are shorter on average than the lengths of the interconnection layers in the peripheral circuit region. Since the average length of the interconnection layers in the function cell region is relatively short, there is no problem with an increase in the resistance of the interconnections in the function cell region even though the thicknesses of the interconnection layers are reduced. In the function cell region, the interconnections need to be arranged as close as possible for scaling down the function cell, for which reason the increase in the interconnection capacitance between the adjacent two interconnections and a time delay of signal transmission on the interconnections would be more important and serious issues for the function cell. In accordance with the present invention, the thickness of the interconnection in the function cell region is substantially reduced so as to reduce the interconnection capacitance between the adjacent two interconnections and suppress the time-delay of signal transmissions on the interconnections in the function cell region.

On the other hand, in the circuit region, the average length of the interconnections is relatively long, for which reason increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the function cell region in order to reduce the resistance of the interconnection layers in the circuit region.

It is preferable that the interconnection layer in the function cell region has a first thickness and the interconnection layer in the circuit region has a second thickness which is larger than the first thickness.

It is also preferable that the first thickness is approximately equal to a half of the second thickness.

It is also preferable that the function cell region includes at least a field effect transistor with a gate electrode film, and the interconnection layer in the function cell region has a first thickness and the interconnection layer in the circuit region has a second thickness which is equal to the sum of the first thickness and a thickness of the gate electrode film.

It is also preferable that the interconnection layer has a uniform top surface level across the function cell region and the circuit region.

It is also preferable that the interconnection layer has a uniform bottom surface level across the function cell region and the circuit region.

It is also preferable that the interconnection layer comprises a single layer which is mainly made of aluminum.

It is also preferable that the interconnection layer comprises a titanium layer extending across the function cell region and the circuit region, a first titanium nitride layer being laminated on the titanium layer and extending across the function cell region and the circuit region, a first aluminum layer being laminated on the first titanium nitride layer and extending across the function cell region and the circuit region, a second titanium nitride layer being laminated on the first aluminum layer and extending across the function cell region and the circuit region, a second aluminum layer being laminated on the second titanium nitride layer and extending across the circuit region, and a third titanium nitride layer laminated on the second aluminum layer and extending across the circuit region.

The seventh embodiment of the present invention provides a semiconductor integrated circuit device has at least a function cell region and a circuit region, both of which are monolithically integrated on a semiconductor substrate. A first inter-layer insulator extends across the function cell region and the circuit region. A first interconnection layer extends over the first inter-layer insulator and extending across the function cell region and the circuit region. A second inter-layer insulator extends over the first interconnection layer and extending across the function cell region and the circuit region. The second inter-layer insulator has a first via hole in the macro cell region and a second via hole in the circuit region. A second interconnection layer extends over the second inter-layer insulator and extending across the function cell region and the circuit region. The second interconnection layer is electrically connected via the first and second via holes to the first interconnection layer. It is important for the present invention that the first interconnection layer in the function cell region is thinner than the interconnection layer in the circuit region, and that the second inter-layer insulator layer has a flat top surface over the macro cell region and the circuit region.

The lengths of the first and second interconnection layers in the micro cell region are shorter on the average than the lengths of the first and second interconnection layers in the peripheral circuit region. Since the average length of the first and second interconnection layers in the micro cell region is relatively short, there is no problem with an increase in the resistance of the interconnections in the macro cell region even though the thicknesses of the interconnection layers are reduced. In the macro cell region, the interconnections need to be arranged as close as possible for scaling down the macro cell, for which reason the increase in the interconnection capacitance between the adjacent two interconnections and a time delay of signal transmission on the interconnections would be more important for the macro cell. In accordance with the present invention, the thickness of the interconnection in the macro cell region is substantially reduced so as to reduce the interconnection capacitance between the adjacent two interconnections and suppress the time-delay of signal transmissions on the interconnections in the macro cell region.

On the other hand, in the circuit region, the average length of the interconnections is relatively long, for which reason an increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the macro cell region in order to reduce the resistance of the interconnection layers in the circuit region.

It is preferable that the first interconnection layer in the macro cell region has a first thickness and the first interconnection layer in the circuit region has a second thickness which is approximately equal to two times of the first thickness.

It is also preferable that the macro cell region includes at least a field effect transistor with a gate electrode film, and the first interconnection layer in the macro cell region has a first thickness and the first interconnection layer in the circuit region has a second thickness which is equal to the sum of the first thickness and a thickness of the gate electrode film.

It is also preferable that the first interconnection layer has a uniform top surface level across the macro cell region and the circuit region.

It is also preferable that the first interconnection layer has a uniform bottom surface level across the macro cell region and the circuit region.

It is also preferable that the second interconnection layer in the function cell region is thinner than the second interconnection layer in the circuit region.

It is also preferable that the second interconnection layer has a uniform thickness across the function cell region and the circuit region.

It is also preferable that the second inter-layer insulator in the macro cell region is thicker than the second inter-layer insulator in the circuit region and the first via hole in the macro cell region has a larger depth than the second via hole in the circuit region.

It is also preferable that each of the first and second interconnection layers comprises a single layer which is mainly made of aluminum.

It is also preferable that each of the first and second interconnection layers comprises a titanium layer extending across the macro cell region and the circuit region, a first titanium nitride layer being laminated on the titanium layer and extending across the macro cell region and the circuit region, a first aluminum layer being laminated on the first titanium nitride layer, the first aluminum layer extending across the macro cell region and the circuit region, a second titanium nitride layer being laminated on the first aluminum layer and extending across the macro cell region and the circuit region, a second aluminum layer being laminated on the second titanium nitride layer and extending across the circuit region, and a third titanium nitride layer laminated on the second aluminum layer and extending across the circuit region.

The eighth embodiment of the present invention provides a semiconductor device comprising a semiconductor substrate and at least a macro cell region and a circuit region, both of which are monolithically integrated on the semiconductor substrate. A first inter-layer insulator extends across the macro cell region and the circuit region. A first interconnection layer extends over the first inter-layer insulator and extends across the macro cell region and the circuit region. A second inter-layer insulator extends over the first interconnection layer and extending across the macro cell region and the circuit region. A second interconnection layer extends over the second interlayer insulator and extending across the macro cell region and the circuit region. It is important that the first interconnection layer in the function cell region is thinner than the first interconnection layer in the circuit region, and that the first interconnection layer has the same top level across the macro cell region and the circuit region as well as the first interconnection layer in the function cell region has a higher bottom level than the first interconnection layer in the circuit region. It is also important that the interconnection layer has flat top and bottom surfaces across the macro cell region and the circuit region.

The lengths of the first and second interconnection layers in the micro cell region are shorter on average than the lengths of the first and second interconnection layers in the peripheral circuit region. Since the average length of the first and second interconnection layers in the micro cell region is relatively short, there is no problem with an increase in the resistance of the interconnections in the macro cell region even though the thicknesses of the interconnection layers are reduced. In the macro cell region, the interconnections need to be arranged as close as possible for scaling down the macro cell, for which reason the increase in the interconnection capacitance between the adjacent two interconnections and a time delay of signal transmission on the interconnections would be more important for the macro cell. In accordance with the present invention, the thickness of the interconnection in the macro cell region is substantially reduced so as to reduce the interconnection capacitance between the adjacent two interconnections and suppress the time-delay of signal transmissions on the interconnections in the macro cell region.

On the other hand, in the circuit region, the average length of the interconnections is relatively long, for which reason increase in the resistance of the interconnections due to reduction in the thickness of the interconnection is a serious problem for the circuit. Notwithstanding, in accordance with the present invention, the thickness of the interconnection layers in the circuit region is thicker than the interconnection layers in the macro cell region in order to reduce the resistance of the interconnection layers in the circuit region.

It is also preferable that the first interconnection layer in the macro cell region has a first thickness and the first interconnection layer in the circuit region has a second thickness which is approximately equal to two times the first thickness.

It is also preferable that the macro cell region includes at least a field effect transistor with a gate electrode film, and the first interconnection layer in the macro cell region has a first thickness and the first interconnection layer in the circuit region has a second thickness which is equal to the sum of the first thickness and a thickness of the gate electrode film.

It is also preferable that the first interconnection layer has a uniform bottom surface level across the macro cell region and the circuit region.

It is also preferable that the second interconnection layer in the function cell region is thinner than the second interconnection layer in the circuit region.

It is also preferable that the second interconnection layer has a uniform thickness across the function cell region and the circuit region.

It is also preferable that the second inter-layer insulator in the macro cell region is thicker than the second inter-layer insulator in the circuit region and the first via hole in the macro cell region has a larger depth than the second via hole in the circuit region.

It is also preferable that each of the first and second interconnection layers comprises a single layer which is mainly made of aluminum.

It is also preferable that each of the first and second interconnection layers comprises a titanium layer extending across the macro cell region and the circuit region, a first titanium nitride layer laminated on the titanium layer and extending across the macro cell region and the circuit region, a first aluminum layer being laminated on the first titanium nitride layer and extending across the macro cell region and the circuit region, a second titanium nitride layer laminated on the first aluminum layer and extending across the macro cell region and the circuit region, a second aluminum layer laminated on the second titanium nitride layer and extending across the circuit region, and a third titanium nitride layer laminated on the second aluminum layer and extending across the circuit region.

PREFERRED EMBODIMENTS

A first embodiment according to the present invention provides a semiconductor integrated circuit device which has a macro cell region and a peripheral circuit region wherein multi-level interconnection layers are provided which extend across the macro cell region and the peripheral circuit region. FIG. 4 is a fragmentary cross sectional elevation view illustrative of a novel semiconductor device having a macro cell region and a circuit region wherein improved interconnection layers extending across the macro cell region and the circuit region.

A macro cell and a peripheral circuit region are monolithically integrated on a semiconductor substrate 1. A field oxide film 2 is selectively formed on a surface of the semiconductor substrate 1 at the boundary between the macro cell region and the peripheral circuit region. Both in the macro cell region and the peripheral circuit region, a plurality of field effect transistors are formed on the surface of the semiconductor substrate 1. Gate oxide films 3 having a thickness of 65 angstroms are formed on the surface of the semiconductor substrate 1. Gate electrodes 4 are formed on the gate oxide films 3. The gate electrodes 4 comprise polysilicon films having a thickness of 1500 angstroms. Side wall oxide films 5 are provided at opposite sides of each of the gate electrodes 4 to form lightly doped drain structures.

A first inter-layer insulator 6 is entirely formed over the semiconductor substrate 1 so that the first inter-layer insulator 6 covers the gate electrodes 4 of the field effect transistors. The first inter-layer insulator 6 is made of silicon oxide and boron-phosphate silicate glass. Contact holes 7 are selectively formed in the first inter-layer insulator 6. The contact holes 7 are filled with a refractory metal, for example, tungsten 8a. The first inter-layer insulator 6 has a top surface planerized across the macro cell region and the peripheral circuit region. First interconnection layers 9a and 9b are selectively formed which extend across the macro cell region and the peripheral circuit region. The first interconnection layers 9a and 9b are mainly made of aluminum. The first interconnection layers 9a are located in the macro cell region and the first interconnection layers 9b are located in the peripheral circuit region. The first interconnection layers 9a and 9b are connected via the contact holes 7 filled with the tungsten 8a to the field effect transistors. A thickness of the first interconnection layers 9a located in the macro cell region is a half of a thickness of the first interconnection layers 9b located in the peripheral circuit region. For example, the first interconnection layers 9a located in the macro cell region has a thickness of 0.3 micrometers, whilst the first interconnection layers 9b located in the peripheral circuit region has a thickness of 0.6 micrometers. Notwithstanding, the first interconnection layers 9a located in the macro cell region has the same width as the first interconnection layers 9b located in the peripheral circuit region, for example, the width of the interconnection layers 9a and 9b is 0.3 micrometers. Over the macro cell region and the peripheral circuit region, the first interconnection layers 9a and 9b are arranged in parallel to each other at a constant pitch of 0.4 micrometers in consideration of facilitated circuit layout design. As a design modification, it is however possible to arrange the first interconnection layers 9a and 9b at various pitches or different pitches across the macro cell region and the peripheral circuit region.

A second inter-layer insulator 10 is entirely provided over the first inter-layer insulator 6 so that the second inter-layer insulator 10 covers the first interconnection layers 9a and 9b. The second inter-layer insulator 10 is made of silicon oxide and deposited by a plasma chemical vapor deposition method. The second inter-layer insulator 10 has a top surface planerized across the macro cell region and the peripheral circuit region. Via holes 11 are selectively formed in the second inter-layer insulator 10. A barrier metal layer 12 is formed on the bottom and side wall of each of the via holes 11 as well as selectively formed over the top surface of the second inter-layer insulator 10. The barrier metal layer 12 comprises laminations of a titanium nitride film having a thickness of 1000 angstroms and a titanium film having a thickness of 300 angstroms. Each of the via holes 11 coated by the barrier metal layer 12 is filled with a tungsten 8b. Second interconnection layers 13a and 13b are provided on the second inter-layer insulator 10. The second interconnection layers 13a and 13b are mainly made of aluminum. The second interconnection layers 13a are located in the macro cell region, whilst the second interconnection layers 13b are located in the peripheral circuit region. The second interconnection layers 13a located in the macro cell region differs in thickness from the second interconnection layers 13b located in the peripheral circuit region. The thickness of the second interconnection layers 13a located in the macro cell region is a half of the thickness of the second interconnection layers 13b located in the peripheral circuit region. For example, the second interconnection layers 13a located in the macro cell region has a thickness of 0.3 micrometers, whilst the second interconnection layers 13b located in the peripheral circuit region has a thickness of 0.6 micrometers. A cover layer 14 is further provided which covers the second interconnection layers 13a and 13b. The cover layer 14 is made of silicon oxide nitride, SiON.

The lengths of the first and second interconnection layers 9a and 13a in the micro cell region are shorter on the average than the lengths of the first and second interconnection layers 9b and 13b in the peripheral circuit region. Since the average lengths of the first and second interconnection layers 9a and 13a in the macro cell region are relatively short, there is no problem with an increase in the resistance of the interconnections in the macro cell region even though the thicknesses of the interconnection layers 9a and 13a are reduced. In the macro cell region, the interconnections 9a and 13a need to be arranged as close as possible for scaling down the macro cell, for which reason the increase in the interconnection capacitance between the adjacent two interconnections and a time delay of signal transmission on the interconnections would be more important for the macro cell. In accordance with the present invention, the thickness of the interconnection in the macro cell region is substantially reduced so as to reduce the interconnection capacitance between the adjacent two interconnections and suppress the time-delay of signal transmissions on the interconnections in the macro cell region.

On the other hand, in the peripheral circuit region, the average lengths of the interconnections are relatively long, for which reason an increase in the resistance of the interconnections due to reduction in the thickness of the interconnection is a serious problem for the peripheral circuit. Notwithstanding, in accordance with the present invention, the thickness of the interconnection layers in the peripheral circuit region is thicker than the interconnection layers in the macro cell region in order to reduce the resistance of the interconnection layers in the peripheral circuit region.

FIG. 5 is a diagram illustrative of variations in time-delay of signal transmission on interconnection layers of 8 mm and 2 mm lengths over thickness of the interconnection layers, wherein the pitch between adjacent two interconnections is set at 0.7 micrometers. FIG. 6 is a circuit diagram illustrative of a logic circuit used for measuring the variations in time-delay of signal transmission on interconnection layers.

A gate length of the p-channel and n-channel transistors is 0.18 micrometers. A gate width of the p-channel transistor is 6 micrometers and a gate width of the n-channel transistor is 5 micrometers. The interconnections are arranged at a constant pitch of 0.7 micrometers. If the length of the interconnection is not more than 2 millimeters, then the reduction in interconnection capacitance between the adjacent interconnections is more important and effective for reduction in the time-delay of signal transmission on the interconnections than reduction in resistance of the interconnection. Accordingly, if the length of the interconnection is not more than 2 millimeters, it is preferable to reduce the thickness of the interconnection layers to reduce the interconnection capacitance between the adjacent interconnection layers even though the resistance of the interconnection layers is somewhat increased due the reduction in the thickness thereof. If, however, the length of the interconnection is not less than 2 millimeters, then the reduction in resistance of the interconnection is more important and effective for reduction in the time-delay of signal transmission on the interconnections than the reduction in resistance interconnection capacitance between the adjacent interconnections. Accordingly, if the length of the interconnection is not less than 2 millimeters, it is preferable to keep the sufficient thickness of the interconnection layers to reduce the resistance of the interconnection layers even though the interconnection capacitance between the adjacent interconnection layers is somewhat increased due the sufficient thickness thereof.

As a comparison, FIG. 7 is a diagram illustrative of variations in time-delay of signal transmissions on interconnection layers of 8 mm and 2 mm lengths over thickness of the interconnection layers, wherein the pitch between adjacent two interconnections is set at 2.4 micrometers. A gate length of the p-channel and n-channel transistors is 0.5 micrometers. A gate width of the p-channel transistor is 6 micrometers and a gate width of the n-channel transistor is 5 micrometers. The interconnections are arranged at a constant pitch of 2.4 micrometers which wider than that in FIG. 5. Even if the length of the interconnection is 8 millimeters, then the reduction in interconnection capacitance between the adjacent interconnections is more important and effective for reduction in the time-delay of signal transmission on the interconnections than reduction in resistance of the interconnection. Accordingly, if the length of the interconnection is not more than 2 millimeters, it is preferable to reduce the thickness of the interconnection layers to reduce the interconnection capacitance between the adjacent interconnection layers even though the resistance of the interconnection layers is somewhat increased due the reduction in the thickness thereof.

FIGS. 8A and 8C are fragmentary cross sectional elevation views illustrative of sequential processes involved in an improved method of forming a novel semiconductor device of FIG. 4.

As illustrated in FIG. 8A, a field oxide film 2 is formed on the semiconductor substrate 1 to define active regions before a well region is formed by ion-implantation. Gate oxide films 3 are formed on the active regions of the semiconductor substrate 1. Gate electrodes 4 made of polysilicon are formed by patterning the polysilicon film so that the gate electrodes 4 are formed on the gate oxide films 3. Ion-implantation is carried out using the gate oxide film as masks to form lightly doped impurity introduced regions. A first silicon oxide film 5 having a thickness of approximately 800 angstroms is entirely formed over the substrate 1 for subsequent anisotropic etching thereto so that the first silicon oxide film 5 remains at opposite sides of each of the gate electrodes 4 to form side wall oxide films 5. A further ion-implantation is carried out using the gate electrode 4 and the side wall oxide films 5 to form source/drain impurity introduced regions for subsequent heat treatment to activate the impurity so that the source/drain diffusion regions are formed in the upper regions of the semiconductor substrate 1. As a result, the field effect transistors are formed in both the macro cell region and the peripheral circuit region.

A silicon oxide film having a thickness of 1000 angstroms is entirely deposited by an atmospheric chemical vapor deposition over the substrate 1. A boron phosphate silicate glass film having a thickness of 12000 angstroms is further entirely deposited on the silicon oxide film by the atmospheric chemical vapor deposition method for a lump anneal at a temperature of 800° C. for ten seconds and subsequent chemical mechanical polishing to the boron phosphate silicate glass film to form a first inter-layer insulator 6 comprising laminations of the silicon oxide film and the boron phosphate silicate glass film wherein the first inter-layer insulator 6 has a thickness of 8000 angstroms. Contact holes 7 are formed in the inter-layer insulator 6. The contact holes 7 are filled with tungsten by a chemical vapor deposition method using $WF_6$ gas. A first interconnection layer 15 mainly made of aluminum and having a thickness of 0.6 micrometers is entirely deposited by sputtering method over the first inter-layer insulator 6.

As illustrated in FIG. 8B, the first interconnection layer 15 only in the macro cell region is subjected to a photo-lithography and a reactive ion etching by use of $Cl_2$ and $O_2$ as source gases so that the thickness of the first interconnection layer 15 only in the macro cell region is reduced from 0.6 micrometers into 0.3 micrometers. As illustrated in FIG. 9, the first interconnection layers 15 only in the macro cell regions 16a, 16b, 16c and 16d are thinner than the peripheral regions.

As illustrated in FIG. 8C, the first interconnection layer 15 is further patterned by a photo-lithography and a reactive ion etching by use of $Cl_2$ and $O_2$ as source gases to thereby form the first interconnections 9a and 9b.

With reference again to FIG. 4, a silicon oxide film having a thickness of 12000 angstroms is entirely deposited over the first interconnections and the first inter-layer insulator 6. The deposited silicon oxide film is then subjected to a chemical mechanical polishing so that the silicon oxide film over the first interconnection 9b in the peripheral circuit region has a thickness of approximately 8000 angstroms to thereby form a second inter-layer insulator 10. Via holes 11 are formed in the second inter-layer insulator 10. A barrier metal layer 12 is entirely formed not only over the second inter-layer insulator 10 but also on the bottom and side walls of the via holes 11, wherein the barrier metal layer comprises a titanium layer of a thickness of 300 angstroms and a titanium nitride layer of 1000 angstroms. A tungsten film having a thickness of 5000 angstroms is entirely formed for subsequent etch back so that the tungsten film 8b remains within the via holes 11. A second interconnection layer 17 mainly made of aluminum and having a thickness of 8000 angstroms is entirely formed over the second inter-layer insulator 10. The second interconnection layer 17 is then subjected to a photo-lithography and a reactive ion etching by use of $Cl_2$ and $O_2$ as source gases so that the thickness of the first interconnection layer 17 only in the macro cell region is reduced from 8000 angstroms into 4000 angstroms. The first interconnection layers 17 only in the macro cell regions are thinner than the other peripheral regions. The second interconnection layer 17 is further patterned by a photo-lithography and a reactive ion etching by use of $Cl_2$ and $O_2$ as source gases to thereby form the second interconnections 13a and 13b. A cover film 14 made of SiON is entirely deposited by a plasma chemical vapor deposition method.

A second embodiment according to the present invention provides a semiconductor integrated circuit device which has a macro cell region and a peripheral circuit region wherein multi-level interconnection layers are provided which extend across the macro cell region and the peripheral circuit region. FIG. 10 is a fragmentary cross sectional elevation view illustrative of a novel semiconductor device having a macro cell region and a circuit region wherein improved interconnection layers extend across the macro cell region and the circuit region in a second embodiment according to the present invention.

A macro cell and a peripheral circuit region are monolithically integrated on a semiconductor substrate 1. A field oxide film 2 is selectively formed on a surface of the semiconductor substrate 1 at the boundary between the macro cell region and the peripheral circuit region. Both in the macro cell region and the peripheral circuit region, a plurality of field effect transistors are formed on the surface of the semiconductor substrate 1. Gate oxide films 3 having a thickness of 65 angstroms are formed on the surface of the semiconductor substrate 1. Gate electrodes 4 are formed on the gate oxide films 3. The gate electrodes 4 comprise polysilicon films having a thickness of 1500 angstroms. Side wall oxide films 5 are provided at opposite sides of each of the gate electrodes 4 to form lightly doped drain structures.

A first inter-layer insulator 6 is entirely formed over the semiconductor substrate 1 so that the first inter-layer insulator 6 covers the gate electrodes 4 of the field effect transistors. The first inter-layer insulator 6 is made of silicon oxide and boron-phosphate silicate glass. Contact holes 7 are selectively formed in the first inter-layer insulator 6. The contact holes 7 are filled with a refractory metal, for example, tungsten 8a. The first inter-layer insulator 6 has a top surface planarized across the macro cell region and the peripheral circuit region. First interconnection layers 9a and 9b are selectively formed which extend across the macro cell region and the peripheral circuit region. The first interconnection layers 9a are located in the macro cell region and the first interconnection layers 9b are located in the peripheral circuit region.

The first interconnection layers 9a located in the macro cell region comprises laminations of a titanium layer 18a having a thickness of 300 angstroms, a titanium nitride layer 19a having a thickness of 1000 angstroms, an aluminum layer 20a having a thickness of 3000 angstroms, and a titanium nitride layer 19b having a thickness of 500 angstroms. The first interconnection layers 9b located in the peripheral circuit region comprises laminations of a titanium layer 18a having a thickness of 300 angstroms, a titanium nitride layer 19a having a thickness of 1000 angstroms, an aluminum layer 20a having a thickness of 3000 angstroms, a titanium nitride layer 19b having a thickness of 500 angstroms, an aluminum layer 20b having a thickness of 3000 angstroms, and a titanium nitride layer 19c having a thickness of 500 angstroms.

The first interconnection layers 9a and 9b are connected via the contact holes 7 filled with the tungsten 8a to the field effect transistors. A thickness of the first interconnection layers 9a located in the macro cell region is approximately a half of a thickness of the first interconnection layers 9b are located in the peripheral circuit region. Notwithstanding, the first interconnection layers 9a located in the macro cell region has the same width as the first interconnection layers 9b located in the peripheral circuit region, for example, the width of the interconnection layers 9a and 9b is 0.3 micrometers. Over the macro cell region and the peripheral circuit region, the first interconnection layers 9a and 9b are arranged in parallel to each other at a constant pitch of 0.4 micrometers in consideration of facilitated circuit layout design. As a design modification, it is however possible to arrange the first interconnection layers 9a and 9b at various pitches or different pitches across the macro cell region and the peripheral circuit region.

A second inter-layer insulator 10 is entirely provided over the first inter-layer insulator 6 so that the second inter-layer insulator 10 covers the first interconnection layers 9a and 9b. The second inter-layer insulator 10 is made of silicon oxide and deposited by a plasma chemical vapor deposition method. The second inter-layer insulator 10 has a top surface planerized across the macro cell region and the peripheral circuit region. Via holes 11 are selectively formed in the second inter-layer insulator 10. A barrier metal layer 12 is formed on the bottom and side wall of each of the via holes 11 as well as selectively formed over the top surface of the second inter-layer insulator 10. The barrier metal layer 12 comprises laminations of a titanium nitride film having a thickness of 1000 angstroms and a titanium film having a thickness of 300 angstroms. Each of the via holes 11 coated by the barrier metal layer 12 is filled with a tungsten 8b. Second interconnection layers 13a and 13b are provided on the second inter-layer insulator 10. The second interconnection layers 13a are located in the macro cell region, whilst the second interconnection layers 13b are located in the peripheral circuit region.

The second interconnection layers 13a located in the macro cell region comprises laminations of a titanium layer 18a having a thickness of 300 angstroms, a titanium nitride layer 19a having a thickness of 1000 angstroms, an aluminum layer 20a having a thickness of 3000 angstroms, and a titanium nitride layer 19b having a thickness of 500 angstroms. The second interconnection layers 13b located in the peripheral circuit region comprises laminations of a titanium layer 18a having a thickness of 300 angstroms, a titanium nitride layer 19a having a thickness of 1000 angstroms, an aluminum layer 20a having a thickness of 3000 angstroms, a titanium nitride layer 19b having a thickness of 500 angstroms, an aluminum layer 20b having a thickness of 3000 angstroms, and a titanium nitride layer 19c having a thickness of 500 angstroms.

The second interconnection layers 13a located in the macro cell region differs in thickness from the second interconnection layers 13b located in the peripheral circuit region. The thickness of the second interconnection layers 13a located in the macro cell region is approximately a half of the thickness of the second interconnection layers 13b located in the peripheral circuit region. A cover layer 14 is further provided which covers the second interconnection layers 13a and 13b. The cover layer 14 is made of silicon oxide nitride, SiON.

The lengths of the first and second interconnection layers 9a and 13a in the micro cell region are shorter on average than the lengths of the first and second interconnection layers 9b and 13b in the peripheral circuit region. Since the average lengths of the first and second interconnection layers 9a and 13a in the micro cell region are relatively short, there is no problem with increase in the resistance of the interconnections is raised in the macro cell region even though the thicknesses of the interconnection layers 9a and 13a are reduced. In the macro cell region, the interconnections 9a and 13a need to be arranged as close as possible for scaling down the macro cell, for which reason the increase in the interconnection capacitance between the adjacent two interconnections and a time delay of signal transmission on the interconnections would be more important and serious issues for the macro cell. In accordance with the present invention, the thickness of the interconnection in the macro cell region is substantially reduced so as to reduce the interconnection capacitance between the adjacent two interconnections and suppress the time-delay of signal transmission on the interconnections in the macro cell region.

On the other hand, in the peripheral circuit region, the average lengths of the interconnections are relatively long, for which reason an increase in the resistance of the interconnections due to reduction in the thickness of the interconnection is a serious problem for the peripheral circuit. Notwithstanding, in accordance with the present invention, the thickness of the interconnection layers in the peripheral circuit region is thicker than the interconnection layers in the macro cell region in order to reduce the resistance of the interconnection layers in the peripheral circuit region.

The description will focus on the fabrication processes. A field oxide film 2 is formed on the semiconductor substrate 1 to define active regions before a well region is formed by ion-implantation. Gate oxide films 3 are formed on the active regions of the semiconductor substrate 1. Gate electrodes 4 made of polysilicon are formed by patterning the polysilicon film so that the gate electrodes 4 are formed on the gate oxide films 3. Ion-implantation is carried out using the gate oxide film as masks to form lightly doped impurity introduced regions. A first silicon oxide film 5 having a thickness of approximately 800 angstroms is entirely formed over the substrate 1 for subsequent anisotropic etching thereto so that the first silicon oxide film 5 remains at opposite sides of each of the gate electrodes 4 to form side wall oxide films 5. A further ion-implantation is carried out using the gate electrode 4 and the side wall oxide films 5 to form source/drain impurity introduced regions for subsequent heat treatment to activate the impurity so that the source/drain diffusion regions are formed in the upper regions of the semiconductor substrate 1. As a result, the field effect transistors are formed in both the macro cell region and the peripheral circuit region.

A silicon oxide film having a thickness of 1000 angstroms is entirely deposited by an atmospheric chemical vapor deposition over the substrate 1. A boron phosphate silicate glass film having a thickness of 12000 angstroms is further entirely deposited on the silicon oxide film by the atmospheric chemical vapor deposition method for a lump anneal at a temperature of 800° C. for ten seconds and subsequent chemical mechanical polishing to the boron phosphate silicate glass film to form a first inter-layer insulator 6 comprising laminations of the silicon oxide film and the boron phosphate silicate glass film wherein the first inter-layer insulator 6 has a thickness of 8000 angstroms. Contact holes 7 are formed in the inter-layer insulator 6. The contact holes 7 are filled with tungsten by a chemical vapor deposition method using $WF_6$ gas.

A titanium layer 18a having a thickness of 300 angstroms is entirely formed across the macro cell region and the peripheral circuit region. A titanium nitride layer 19a having a thickness of 1000 angstroms is also entirely formed across the macro cell region and the peripheral circuit region. An aluminum layer 20a having a thickness of 3000 angstroms is entirely formed across the macro cell region and the peripheral circuit region. A titanium nitride layer 19b having a thickness of 500 angstroms is entirely formed across the macro cell region and the peripheral circuit region. Further, an aluminum layer 20b having a thickness of 3000 angstroms is entirely formed across the macro cell region and the peripheral circuit region. A titanium nitride layer 19c having a thickness of 500 angstroms entirely formed across the macro cell region and the peripheral circuit region.

The titanium nitride layer 19c and the aluminum layer 20b are selectively etched only in the macro cell region and subsequently the above laminations are patterned by a photo-lithography and a reactive ion etching by use of $Cl_2$ and $O_2$ as source gases to thereby form the first interconnections 9a and 9b.

A silicon oxide film having a thickness of 12000 angstroms is entirely deposited over the first interconnections and the first inter-layer insulator 6. The deposited silicon oxide film is then subjected to a chemical mechanical polishing so that the silicon oxide film over the first interconnection 9b in the peripheral circuit region has a thickness of approximately 8000 angstroms to thereby form a second inter-layer insulator 10. Via holes 11 are formed in the second inter-layer insulator 10. A barrier metal layer 12 is entirely formed not only over the second inter-layer insulator 10 but also on the bottom and side walls of the via holes 11, wherein the barrier metal layer comprises a titanium layer of a thickness of 300 angstroms and a titanium nitride layer of 1000 angstroms. A tungsten film having a thickness of 5000 angstroms is entirely formed for subsequent etch back so that the tungsten film 8b remains within the via holes 11.

A titanium layer 18a having a thickness of 300 angstroms is entirely formed across the macro cell region and the peripheral circuit region. A titanium nitride layer 19a having a thickness of 1000 angstroms is also entirely formed across the macro cell region and the peripheral circuit region. An aluminum layer 20a having a thickness of 3000 angstroms is entirely formed across the macro cell region and the peripheral circuit region. A titanium nitride layer 19b having a thickness of 500 angstroms is entirely formed across the macro cell region and the peripheral circuit region. Further, an aluminum layer 20b having a thickness of 3000 angstroms is entirely formed across the macro cell region and the peripheral circuit region. A titanium nitride layer 19c having a thickness of 500 angstroms entirely formed across the macro cell region and the peripheral circuit region.

The titanium nitride layer 19c and the aluminum layer 20b are selectively etched only in the macro cell region and subsequently the above laminations are patterned by a photo-lithography and a reactive ion etching by use of $Cl_2$ and $O_2$ as source gases to thereby form the second interconnections 13a and 13b.

The titanium nitride film 19c serves as an anti-reflection film in the photo-lithography process for selective etching, the titanium nitride film 19b serves as an etching stopper.

A third embodiment according to the present invention provides a semiconductor integrated circuit device which has a macro cell region and a peripheral circuit region wherein multi-level interconnection layers are provided which extend across the macro cell region and the peripheral circuit region. FIG. 11 is a fragmentary cross sectional elevation view illustrative of a novel semiconductor device having a macro cell region and a circuit region wherein improved interconnection layers extending across the macro cell region and the circuit region in a third embodiment according to the present invention.

A macro cell and a peripheral circuit region are monolithically integrated on a semiconductor substrate 1. A field oxide film 2 is selectively formed on a surface of the semiconductor substrate 1 at the boundary between the macro cell region and the peripheral circuit region. Both in the macro cell region and the peripheral circuit region, a plurality of field effect transistors are formed on the surface of the semiconductor substrate 1. Gate oxide films 3 having a thickness of 65 angstroms are formed on the surface of the semiconductor substrate 1. Gate electrodes 4 are formed on the gate oxide films 3. The gate electrodes 4 comprise polysilicon films having a thickness of 1500 angstroms. Side wall oxide films 5 are provided at opposite sides of each of the gate electrodes 4 to form lightly doped drain structures.

A silicon oxide film 21 is entirely formed over the semiconductor substrate 1 by a bias electron cyclotron resonance plasma chemical vapor deposition method so that the silicon oxide film 21 covers the gate electrodes 4 of the field effect transistors. The silicon oxide film 21 has varied top levels. The top of the silicon oxide film 21 over the gate electrodes 4 is higher by the thickness of the gate electrode 4 than the top of the silicon oxide film 21 over the semiconductor substrate 1. Trapezoidal shape supper surfaces are formed of the silicon oxide film 21 over the gate electrodes 4. Contact holes 7 are selectively formed in the silicon oxide film 21. The contact holes 7 are filled with a refractory metal, for example, tungsten 8a. First interconnection layers 9a and 9b are selectively formed which extend across the macro cell region and the peripheral circuit region. The first interconnection layers 9a are located in the macro cell region and the first interconnection layers 9b are located in the peripheral circuit region. The first interconnection layers 9a and 9b are mainly made of aluminum. The first interconnection layers 9a and 9b are connected via the contact holes 7 filled with the tungsten 8a to the field effect transistors. Since the first interconnection layers 9a and 9b extending over the silicon oxide film 21, the bottom levels of the first interconnection layers 9a and 9b is varied in accordance with the variation in level of the surface of the silicon oxide film 21 whilst the top level of the first interconnection layers 9a and 9b is uniform. A thickness of the first interconnection layers 9a located in the macro cell region is thinner by the gate electrode thickness than a thickness of the first interconnection layers 9b located in the peripheral circuit region. Notwithstanding, the first interconnection layers 9a located in the macro cell region has the same width as the first interconnection layers 9b located in the peripheral circuit region, for example, the width of the interconnection layers 9a and 9b is 0.3 micrometers. Over the macro cell region and the peripheral circuit region, the first interconnection layers 9a and 9b are arranged in parallel to each other at a constant pitch of 0.4 micrometers in consideration of facilitated circuit layout design. As a design modification, it is however possible to arrange the first interconnection layers 9a and 9b at various pitches or different pitches across the macro cell region and the peripheral circuit region. A first inter-layer insulator 6 is formed over the silicon oxide film 21 but the top level of the first inter-layer insulator 6 is the same as the first interconnection layers 9a and 9b.

A second inter-layer insulator 10 is entirely provided over the first inter-layer insulator 6 so that the second inter-layer insulator 10 covers the first interconnection layers 9a and 9b. The second inter-layer insulator 10 is made of silicon oxide and deposited by a plasma chemical vapor deposition method. The second inter-layer insulator 10 has a top surface planerized across the macro cell region and the peripheral circuit region. Via holes 11 are selectively formed in the second inter-layer insulator 10. A barrier metal layer 12 is formed on the bottom and side wall of each of the via holes 11 as well as selectively formed over the top surface of the second inter-layer insulator 10. The barrier metal layer 12 comprises laminations of a titanium nitride film having a thickness of 1000 angstroms and a titanium film having a thickness of 300 angstroms. Each of the via holes 11 coated by the barrier metal layer 12 is filled with a tungsten 8b. Second interconnection layers 13a and 13b are provided on the second inter-layer insulator 10. The second interconnection layers 13a are located in the macro cell region, whilst the second interconnection layers 13b are located in the peripheral circuit region. The second interconnection layers 13a and 13b are mainly made of aluminum and have a uniform thickness. A cover layer 14 is further provided which covers the second interconnection layers 13a and 13b. The cover layer 14 is made of silicon oxide nitride, SiON.

The lengths of the first and second interconnection layers 9a and 13a in the micro cell region are shorter on the average than the lengths of the first and second interconnection layers 9b and 13b in the peripheral circuit region. Since the average lengths of the first and second interconnection layers 9a and 13a in the micro cell region are relatively short, there is no problem with an increase in the resistance of the interconnections is raised in the macro cell region even though the thicknesses of the interconnection layers 9a and 13a are reduced. In the macro cell region, the interconnections 9a and 13a need to be arranged as close as possible for scaling down the macro cell, for which reason the increase in the interconnection capacitance between the adjacent two interconnections and a time delay of signal transmissions on the interconnections would be more important and serious issues for the macro cell. In accordance with the present invention, the thickness of the interconnection in the macro cell region is substantially reduced so as to reduce the interconnection capacitance between the adjacent two interconnections and suppress the time-delay of signal transmission on the interconnections in the macro cell region.

On the other hand, in the peripheral circuit region, the average lengths of the interconnections are relatively long, for which reason an increase in the resistance of the interconnections due to reduction in the thickness of the interconnection is serious problem for the peripheral circuit. Notwithstanding, in accordance with the present invention, the thickness of the interconnection layers in the peripheral circuit region is thicker than the interconnection layers in the macro cell region in order to reduce the resistance of the interconnection layers in the peripheral circuit region.

The description will focus on the fabrication processes. FIGS. 12A and 12C are fragmentary cross sectional elevation views illustrative of sequential processes involved in an improved method of forming a novel semiconductor device of FIG. 11.

As illustrated in FIG. 12A, a field oxide film 2 is formed on the semiconductor substrate 1 to define active regions before a well region is formed by ion-implantation. Gate oxide films 3 are formed on the active regions of the semiconductor substrate 1. Gate electrodes 4 made of polysilicon are formed by patterning the polysilicon film so that the gate electrodes 4 are formed on the gate oxide films 3. Ion-implantation is carried out using the gate oxide film as masks to form lightly doped impurity introduced regions. A first silicon oxide film 5 having a thickness of approximately 800 angstroms is entirely formed over the substrate 1 for subsequent anisotropic etching thereto so that the first silicon oxide film 5 remains at opposite sides of each of the gate electrodes 4 to form side wall oxide films 5. A further ion-implantation is carried out using the gate electrode 4 and the side wall oxide films 5 to form source/drain impurity introduced regions for subsequent heat treatment to activate the impurity so that the source/drain diffusion regions are formed in the upper regions of the semiconductor substrate 1. As a result, the field effect transistors are formed in both the macro cell region and the peripheral circuit region.

A silicon oxide film 21 having a thickness of 8000 angstroms is entirely deposited by a bias cyclotron resonance plasma chemical vapor deposition over the substrate 1. The silicon oxide film 21 has varied top levels. The top of the silicon oxide film 21 over the gate electrodes 4 is higher by the thickness of the gate electrode 4 than the top of the silicon oxide film 21 over the semiconductor substrate 1. Trapezoidal shape supper surfaces are formed of the silicon oxide film 21 over the gate electrodes 4. A triangle shape supper surface is formed of the silicon oxide film 21 over the single gate electrode 4. A silicon nitride film 22 having a thickness of about 500 angstroms is entirely formed by either a plasma chemical vapor deposition method or a low pressure chemical vapor deposition.

As illustrated in FIG. 12B, contact holes 7 are formed in the silicon oxide film 21 and the silicon nitride film 22 by a photo-lithography and a reactive ion-etching process. The contact holes 7 are filled with tungsten by a chemical vapor deposition method using WF6 gas. A silicon oxide film 23 having a thickness of 10000 angstroms is deposited by a plasma chemical vapor deposition method for subsequent chemical mechanical polishing thereto to selectively form trench grooves 24a and 24b which extends to the surface of the silicon nitride film 22 and positioned across the macro cell region and the peripheral circuit region.

As illustrated in FIG. 12C, aluminum films 25a, 25b are formed within the grooves 24a and 24b by a chemical vapor deposition method using tetramethylalmimum Al(CH$_3$)$_3$ as a source gas.

As illustrated in FIG. 11, a silicon oxide film having a thickness of 12000 angstroms is entirely deposited over the first interconnections and the first inter-layer insulator 6. The deposited silicon oxide film is then subjected to a chemical mechanical polishing so that the silicon oxide film over the first interconnection 9b in the peripheral circuit region has a thickness of approximately 8000 angstroms to thereby form a second inter-layer insulator 10. Via holes 11 are formed in the second inter-layer insulator 10. A barrier metal layer 12 is entirely formed not only over the second inter-layer insulator 10 but also on the bottom and side walls of the via holes 11, wherein the barrier metal layer comprises a titanium layer of a thickness of 300 angstroms and a titanium nitride layer of 1000 angstroms. A tungsten film having a thickness of 5000 angstroms is entirely formed for subsequent etch back so that the tungsten film 8b remains within the via holes 11. A second interconnection layer 17 mainly made of aluminum and having a thickness of 8000 angstroms is entirely formed over the second inter-layer insulator 10. The second interconnection layer 17 is then subjected to a photo-lithography and a reactive ion etching by use of Cl$_2$ and O$_2$ as source gases so that the thickness of the first interconnection layer 17 only in the macro cell region is reduced from 8000 angstroms into 4000 angstroms. The first interconnection layers 17 only in the macro cell regions are thinner than the other peripheral regions. The second interconnection layer 17 is further patterned by a photo-lithography and a reactive ion etching by use of Cl$_2$ and O$_2$ as source gases to thereby form the second interconnections 13a and 13b. A cover film 14 made of SiON is entirely deposited by a plasma chemical vapor deposition method.

Whereas modifications of the present invention will be apparent o a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A semiconductor device comprising:

a semiconductor substrate having a first region with first transistors therein and a second region with second transistors therein;

an insulating layer on said substrate and having a planar top surface extending over said first region and said second region;

plural first conductive interconnection lines directly on said top surface of said insulating layer and first vias connecting respective ones of said first interconnection lines to respective ones of said first transistors, said first interconnection lines having lengths across said top surface whose average length is a first average length, and each of said first interconnection lines having a first thickness perpendicular to said top surface and a first width parallel to said top surface; and plural second conductive interconnection lines directly on said top surface of said insulating layer and second vias connecting respective ones of said second interconnection lines to respective ones of said second transistors, said second interconnection lines having lengths across said top surface whose average length is a second average length that is greater than said first average length, and each of said second interconnection lines having said first width and a second thickness perpendicular to said top surface that is greater than said first thickness.

2. The device of claim 1, wherein said second thickness is about twice said first thickness.

3. The device of claim 1, wherein said first average length is less than two millimeters and said second average length is greater than two millimeters.

4. The device of claim 1, wherein said insulating layer has a planar bottom surface.

5. A semiconductor device comprising:

a semiconductor substrate having a first region with first transistors therein and a second region with second transistors therein;

an insulating layer on said substrate and having a planar top surface extending over said first region and said second region;

plural first conductive interconnection lines directly on said top surface of said insulating layer and first vias connecting respective ones of said first interconnection lines to respective ones of said first transistors, said first interconnection lines having lengths across said top surface whose average length is a first average length and thicknesses perpendicular to said top surface whose average thickness is a first average thickness and widths parallel to said top surface whose average width is a first average width; and plural second conductive interconnection lines directly on said top surface of said insulating layer and second vias connecting respective ones of said second interconnection lines to respective ones of said second transistors, said second interconnection lines having lengths across said top surface whose average length is a second average length that is greater than said first average length, and widths parallel to said top surface whose average width is a second average width that is the same as said first average width, and thicknesses perpendicular to said top surface whose average thickness is a second average thickness that is greater than said first average thickness.

6. The device of claim 5, wherein said second average thickness is about twice said first average thickness.

7. The device of claim 5, wherein said first average length is less than two millimeters and said second average length is greater than two millimeters.

8. The device of claim 5, wherein said insulating layer has a planar bottom surface.

9. A semiconductor device comprising:

a semiconductor substrate with plural first transistors and plural second transistors thereon;

an insulating layer on said substrate and that has a planar top surface over said first and second transistors;

plural first conductive interconnection lines that have lengths across said top surface whose average length is less than two millimeters and first vias connecting respective ones of said first interconnection lines to respective ones of said first transistors, each of said first interconnection lines having a first thickness perpendicular to said top surface and a first width parallel to said top surface; and plural second conductive interconnection lines that have lengths across said top surface whose average length is more than two millimeters and second vias connecting respective ones of said second interconnection lines to respective ones of said second transistors, each of said second interconnection lines having said first width and a second thickness perpendicular to said top surface that is about twice said first thickness.

* * * * *